United States Patent
Ohara et al.

(10) Patent No.: US 8,274,619 B2
(45) Date of Patent: Sep. 25, 2012

(54) DISPLAY DEVICE WHEREIN A VALUE OF A CHANNEL WIDTH DIVIDED BY A CHANNEL LENGTH OF ONE TFT IS GREATER THAN ANOTHER TFT, AND A GAP BETWEEN A PIXEL ELECTRODE AND A COUNTER ELECTRODE IS WIDER FOR THE ONE TFT THAN THE ANOTHER TFT

(75) Inventors: Ken Ohara, Chiba (JP); Tsunenori Yamamoto, Hitachi (JP); Yoshiaki Nakayoshi, Oamishirasato (JP); Hiroshi Saito, Fujisawa (JP); Jun Ooida, Mobara (JP)

(73) Assignees: Hitachi Displays, Ltd., Chiba (JP); Panasonic Liquid Crystal Display Co., Ltd., Hyogo-ken (JP)

( * ) Notice: Subject to any disclaimer, the term of this patent is extended or adjusted under 35 U.S.C. 154(b) by 16 days.

(21) Appl. No.: 13/043,374

(22) Filed: Mar. 8, 2011

(65) Prior Publication Data

US 2011/0157508 A1  Jun. 30, 2011

Related U.S. Application Data

(62) Division of application No. 12/014,125, filed on Jan. 15, 2008, now Pat. No. 7,903,218.

(30) Foreign Application Priority Data

Jan. 16, 2007 (JP) ................. 2007-007040

(51) Int. Cl.
*G02F 1/136* (2006.01)
*G02F 1/1333* (2006.01)
*G02F 1/1343* (2006.01)
*G02F 1/13* (2006.01)
*H01L 29/04* (2006.01)
*H01L 29/10* (2006.01)
*H01L 31/00* (2006.01)
*H01L 27/14* (2006.01)
*H01L 29/15* (2006.01)
*H01L 31/036* (2006.01)

(52) U.S. Cl. .......... 349/43; 349/141; 349/138; 349/192; 257/59; 257/72

(58) Field of Classification Search ................. 349/138, 349/141, 192, 43; 257/59, 72
See application file for complete search history.

(56) References Cited

U.S. PATENT DOCUMENTS 6,300,926 B1 * 10/2001 Yoneya et al. ................. 345/87
(Continued)

FOREIGN PATENT DOCUMENTS

JP  2004-004876  1/2004

*Primary Examiner* — Mark Robinson
*Assistant Examiner* — Dennis Y. Kim
(74) *Attorney, Agent, or Firm* — Antonelli, Terry, Stout & Kraus, LLP.

(57) ABSTRACT

A display device which can reduce easily the brightness unevenness produced by the insufficient writing of TFT, wherein, the display device having: a display panel which, over a surface of an insulating substrate, includes plural scanning signal lines; plural picture signal lines; plural TFTs; plural pixel electrodes coupled to sources of the TFTs; and a counter electrode, wherein the pixel and counter electrodes are arranged over the same surface of an insulating layer overlying the surface of the insulating substrate, and when a gate insulating film provided at one TFT among the TFTs is thinner than a gate insulating film provided at another TFT among the TFTs, a gap between a pixel electrode coupled to the source of the one TFT and the counter electrode is set to be wider than a gap between a pixel electrode coupled to the source of the another TFT and the counter electrode.

11 Claims, 21 Drawing Sheets

U.S. PATENT DOCUMENTS

2001/0010575 A1 8/2001 Yoshida et al.
2004/0075783 A1 4/2004 Lee
2005/0242745 A1 11/2005 Jung
2005/0253148 A1 11/2005 Yamazaki et al.

* cited by examiner

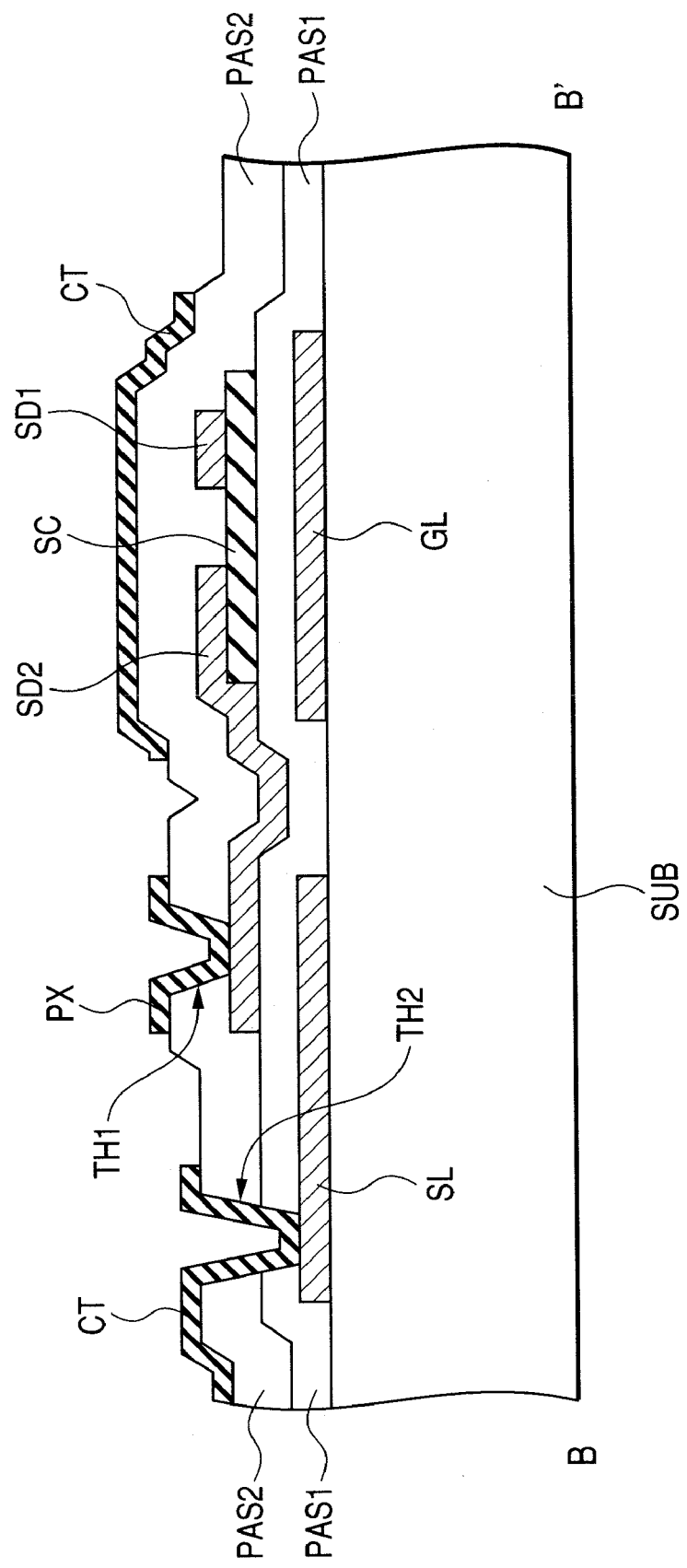

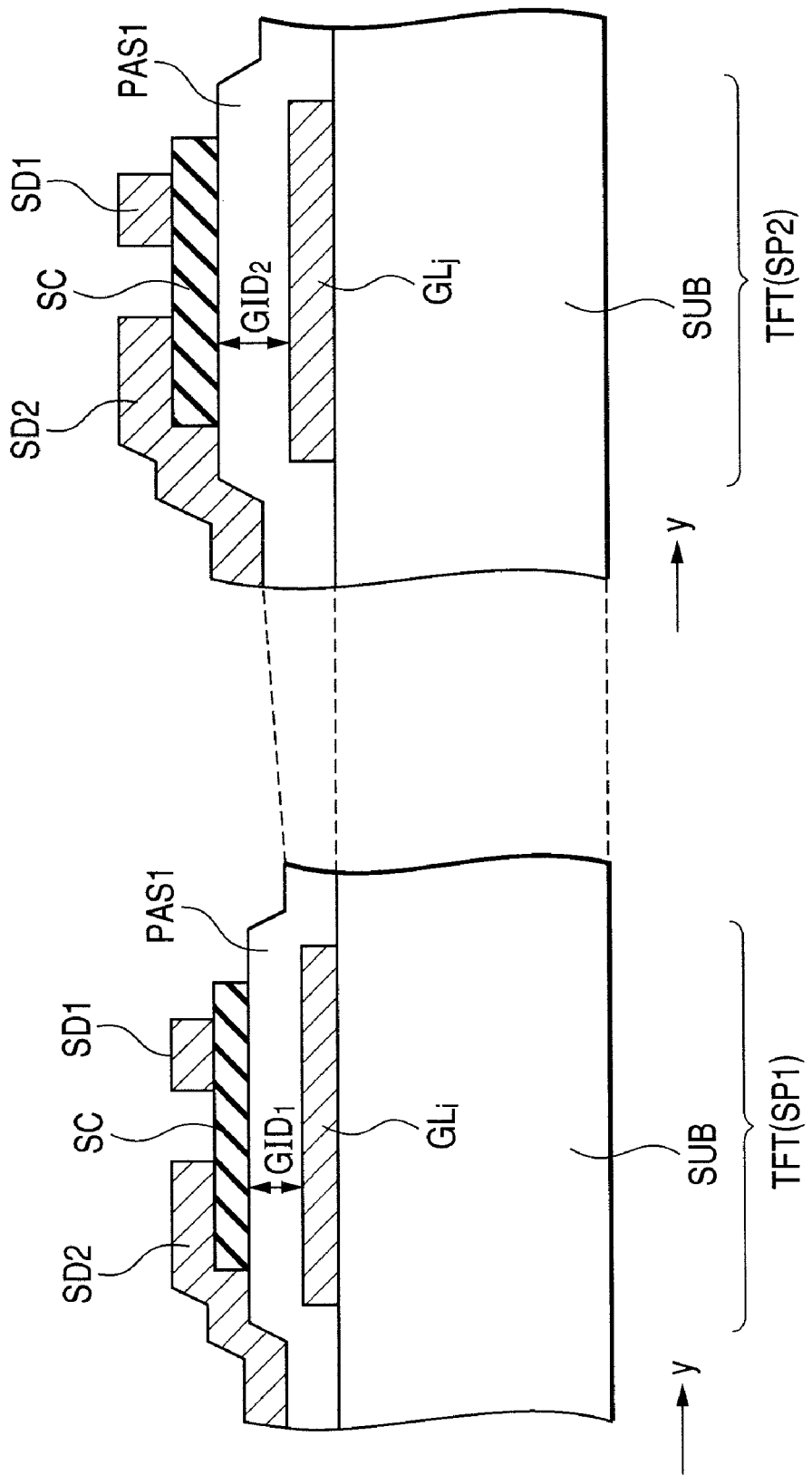

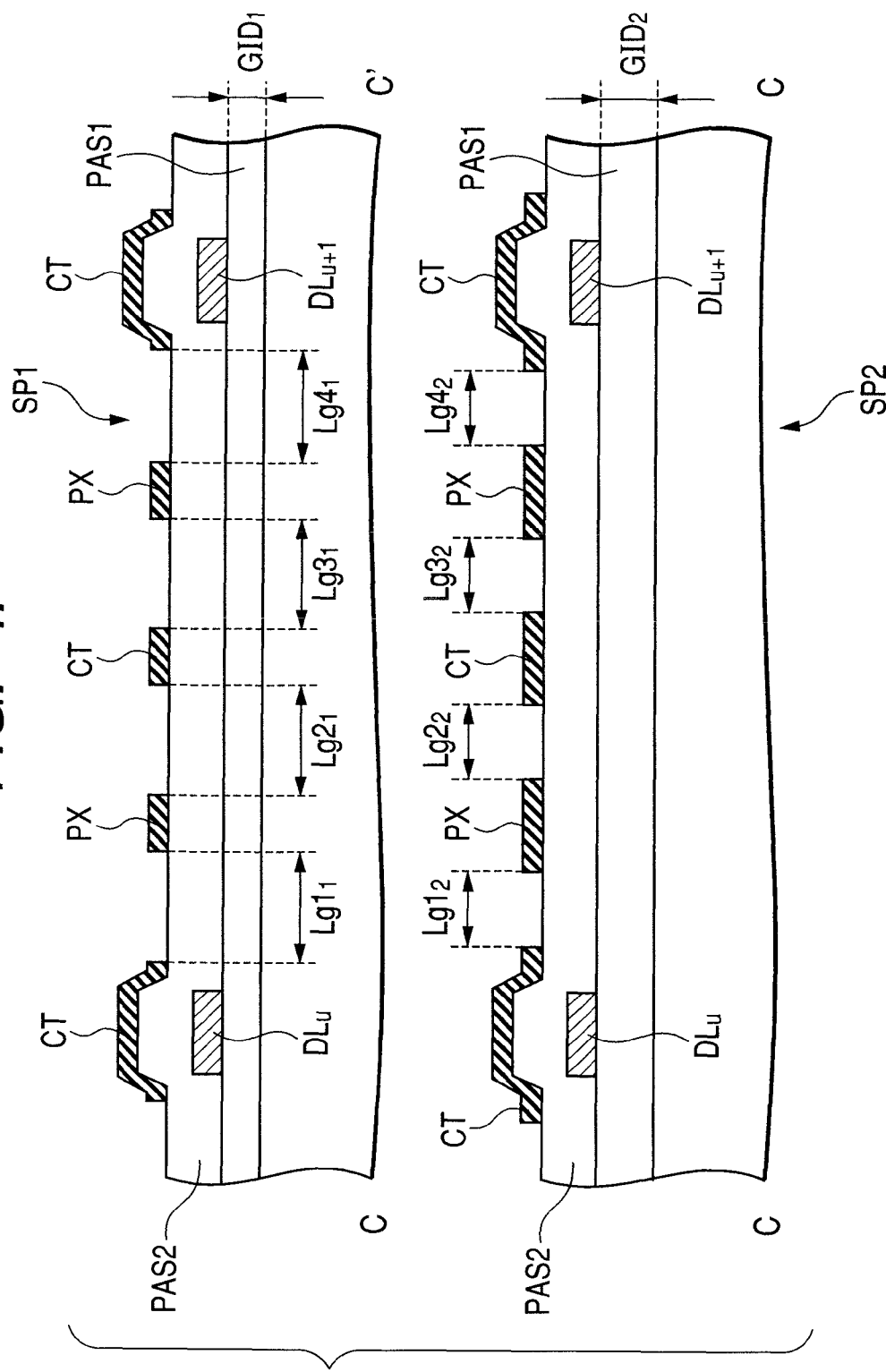

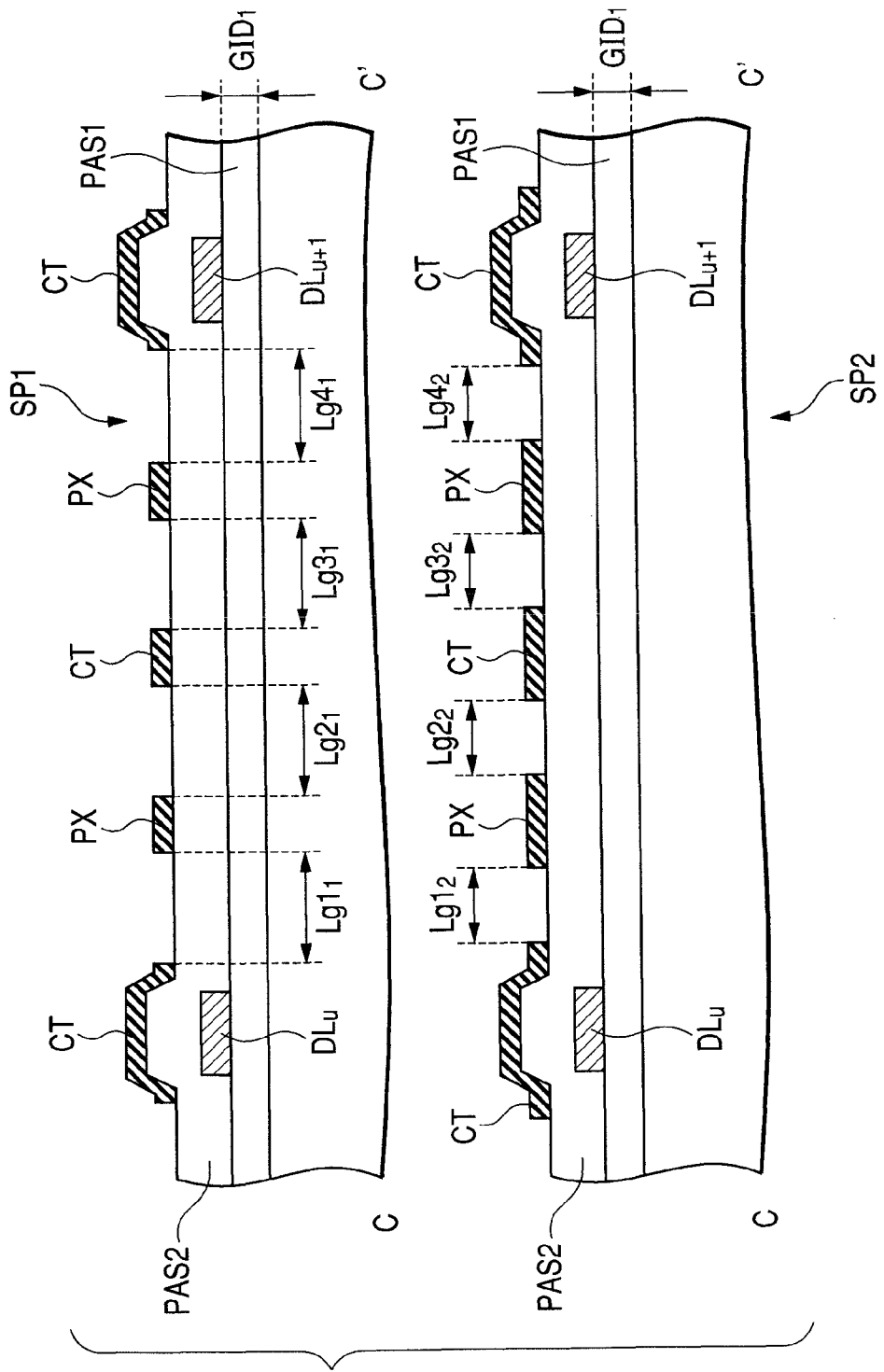

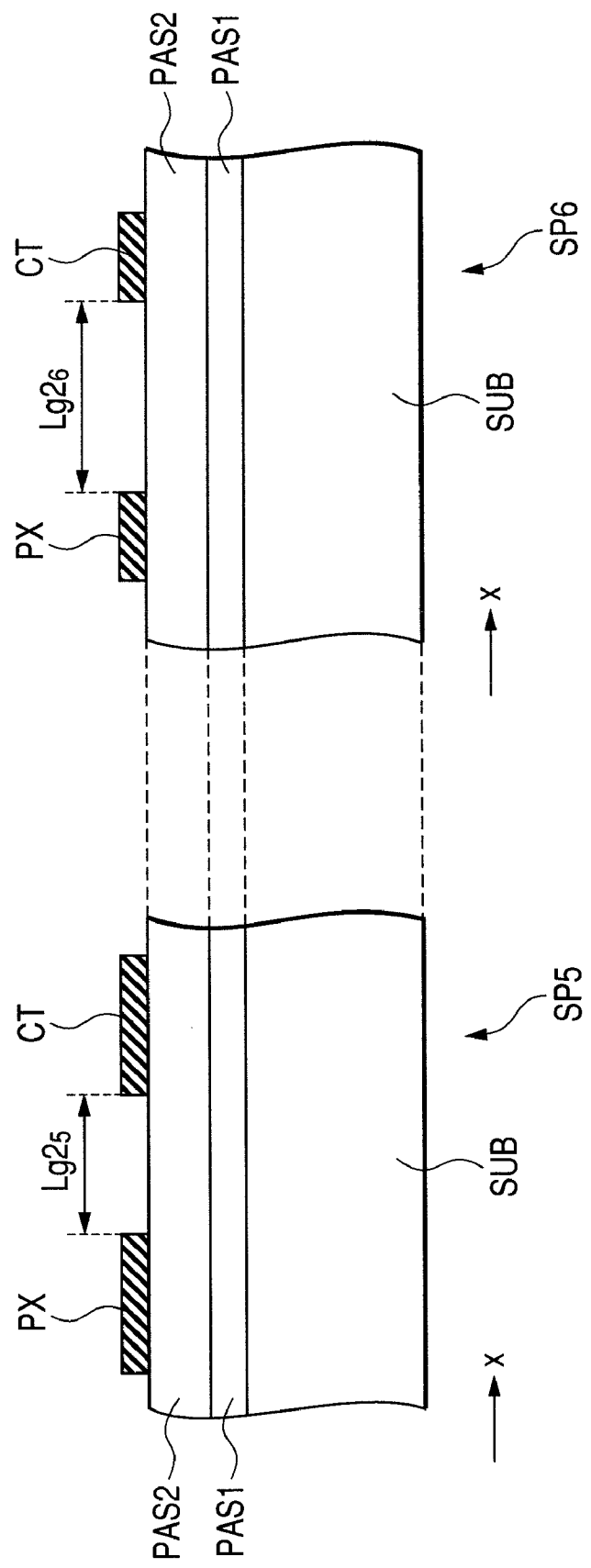

DISPLAY DEVICE WHEREIN A VALUE OF A CHANNEL WIDTH DIVIDED BY A CHANNEL LENGTH OF ONE TFT IS GREATER THAN ANOTHER TFT, AND A GAP BETWEEN A PIXEL ELECTRODE AND A COUNTER ELECTRODE IS WIDER FOR THE ONE TFT THAN THE ANOTHER TFT

CROSS REFERENCE TO RELATED APPLICATION

This application is a Divisional of U.S. application Ser. No. 12/014,125, filed Jan. 15, 2008, now U.S. Pat. No. 7,903,218 which claims priority from Japanese Patent Application No. JP 2007-007040 filed on Jan. 16, 2007, the contents of which are incorporated herein by reference.

BACKGROUND OF THE INVENTION

1. Field of the Invention

The present invention relates to a display device, in particular, to an art which can be applied effectively to a TFT liquid crystal display device.

2. Description of the Related Art

Conventionally, a liquid crystal display device provided with a liquid crystal display panel which encloses a liquid crystal between two substrates is known as one of display devices. The liquid crystal display device includes a so-called active-matrix liquid crystal display device.

The active-matrix liquid crystal display device possesses plural scanning signal lines, plural picture signal lines, plural active elements, plural pixel electrodes, and a counter electrode in the liquid crystal display panel. The active elements and the pixel electrodes are arranged in a matrix. The general active-matrix liquid crystal display device employs a TFT of MIS structure (including MOS structure) as the active element. The pixel electrode is coupled to one of a source and a drain of the TFT. A gate of the TFT is coupled to the scanning signal line. One of the source and drain of the TFT, which is not coupled to the pixel electrode, is coupled to the picture signal line.

In the liquid crystal display panel, the pixel electrode and the counter electrode are electrodes to drive the liquid crystal, and the arrangement method of the pixel electrode and the counter electrode is classified roughly into two methods. The first arrangement method arranges the pixel electrode in one substrate (hereinafter called a TFT substrate) of the two substrates, and the counter electrode in the other substrate (hereinafter called a counter substrate). The second arrangement method arranges the pixel electrode and the counter electrode in the TFT substrate.

The second arrangement method is further classified into two methods: an opposing arrangement to arrange the pixel electrode and the counter electrode in a plane on the same side of an insulating layer which is provided in the TFT substrate, and a laminating arrangement to laminate the pixel electrode and the counter electrode with an intervening insulating layer provided therebetween in the TFT substrate.

In the opposing arrangement to arrange the pixel electrode and the counter electrode in a plane on the same side of an insulating layer which is provided in the TFT substrate, for example, the pixel electrode and the counter electrode, each in a plane shape of comb, are arranged in an opposing manner in a plane, so that the teeth of the two comb-shaped electrodes may be placed alternately.

The liquid crystal display panel, in which the pixel electrode and the counter electrode in a shape of comb are arranged in an opposing manner, drives a liquid crystal generally by the method called a lateral electric field drive method (or simply called in-plane switching method). Therefore, the liquid crystal display panel is easy to realize a wide viewing angle and used for a liquid crystal television etc.

By the way, the active-matrix liquid crystal display device performs display of each pixel by writing to the pixel electrode a brightness level voltage signal currently applied to the picture signal line, in the period when the gate of TFT is ON. Therefore, it is desired to manufacture the TFT substrate so that the write current value of each TFT may become uniform.

However, the conventional manufacturing method of the TFT substrate is susceptible to generate a difference in the write current value of each TFT due to various factors. Therefore, there was a problem that brightness unevenness tends to occur due to insufficient writing of TFT.

As a method of reducing the insufficient writing of each TFT, a method of assuring sufficient writing by a three-level scanning signal is recently proposed, for example (refer to JP-A 2004-004876).

However, when the scanning signal is expressed in terms of a three-level signal as proposed by JP-A 2004-004876, a circuit for converting the scanning signal to a three-level signal is additionally needed in a drive circuit (a driver IC) coupled to a scanning signal line. Therefore, there arises a problem, for example, that the volume of the drive circuit becomes unfavorably larger, making it difficult to realize a liquid crystal display device with a narrower picture frame and what is worse, leading to a rise in the manufacturing cost.

SUMMARY OF THE INVENTION

The present invention has been made in view of the above circumstances and provides an art which can reduce easily the brightness unevenness produced by the insufficient writing of TFT in the liquid crystal display device, for example.

The present invention also provides an art which can reduce the manufacturing cost of the liquid crystal display device which can reduce easily the brightness unevenness produced by the insufficient writing of TFT, for example.

The above-described objects and other objects and the new features provided by the present invention will become clear with the description and accompanying drawings of the present specification.

The following explains outline of typical items of the inventions disclosed by the present application.

(1) A display device including: a display panel which, over a surface of an insulating substrate, includes plural scanning signal lines; plural picture signal lines; plural TFTs; plural pixel electrodes coupled to sources of the TFTs; and a counter electrode, wherein the TFTs and the pixel electrodes are arranged in a matrix in a projection direction of the scanning signal lines and a projection direction of the picture signal lines, and the pixel electrodes and the counter electrode are arranged over the same surface of an insulating layer overlying the surface of the insulating substrate, and wherein, when a gate insulating film provided at one TFT among the TFTs is thinner than a gate insulating film provided at another TFT among the TFTs, a gap between a pixel electrode coupled to the source of the one TFT and the counter electrode is set to be wider than a gap between a pixel electrode coupled to the source of the another TFT and the counter electrode.

(2) A display device including: a display panel which, over a surface of an insulating substrate, includes plural scanning signal lines; plural picture signal lines; plural TFTs; plural pixel electrodes coupled to sources of the TFTs; and a counter electrode, wherein the TFTs and the pixel electrodes are arranged in a matrix in a projection direction of the scanning signal lines and a projection direction of the picture signal lines, and the pixel electrodes and the counter electrode are arranged over the same surface of an insulating layer overlying the surface of the insulating substrate, and wherein, when a value of a channel width divided by a channel length of one TFT among the TFTs is greater than a value of a channel width divided by a channel length of another TFT among the TFTs, a gap between a pixel electrode coupled to the source of the one TFT and the counter electrode is set to be wider than a gap between a pixel electrode coupled to the source of the another TFT and the counter electrode.

(3) The display device according to (2), wherein a gate insulating film in the one TFT is thinner than a gate insulating film in the another TFT.

(4) The display device according to (1) to (3), wherein, assuming $L_{DA}$ to denote a distance between two pixel electrodes most remotely located among the pixel electrodes arranged in a matrix over a sheet of the insulating substrate, a to denote an etching amount difference produced at the gap between the pixel electrode and the counter electrode located at each of the two points mutually separated by the distance $L_{DA}$, and $L_{12}$ to denote a distance between a pixel electrode coupled to the source of the one TFT and a pixel electrode coupled to the source of the another TFT, a gap, $Lg_1$, between the pixel electrode coupled to the source of the one TFT and the counter electrode and a gap, $Lg_2$, between the pixel electrode coupled to the source of the another TFT and the counter electrode satisfy a relationship described by Equation 1.

$$Lg_1 > Lg_2 - \frac{\sigma}{L_{DA}} \times L_{12} \qquad \text{(Equation 1)}$$

(5) The display device according to (1) to (4), wherein, in a number of pixel electrodes aligned in the projection direction of the scanning signal line, a gap between a pixel electrode and the counter electrode is widest when the pixel electrode is located nearest to one of both ends of the scanning signal line in the projection direction of the scanning signal line and the gap becomes narrower as the pixel electrode is located farther away from the one of both ends of the scanning signal line.

(6) The display device according to (1) to (4), wherein, in a number of pixel electrodes aligned in the projection direction of the scanning signal line, a gap between a pixel electrode and the counter electrode is widest when the pixel electrode is located nearest to a specific position to the scanning signal line, the specific position being different from either end of the scanning signal line in the projection direction of the scanning signal line, and the gap becomes narrower as the pixel electrode is located farther away from the specific position to the scanning signal line.

(7) The display device according to (6), wherein the specific position to the scanning signal line is a median point of both ends of the insulating substrate, the both ends being in the same direction as the projection direction of the scanning signal line.

(8) The display device according to (6), wherein the specific position to the scanning signal line is a median point of both ends of the scanning signal line, the both ends being in the projection direction of the scanning signal line concerned.

(9) The display device according to (1) to (8), wherein, in a number of pixel electrodes aligned in the projection direction of the picture signal line, a gap between a pixel electrode and the counter electrode is widest when the pixel electrode is located nearest to one of both ends of the picture signal line in the projection direction of the picture signal line and the gap becomes narrower as the pixel electrode is located farther away from the one of both ends of the picture signal line.

(10) The display device according to (1) to (8), wherein, in a number of pixel electrodes aligned in the projection direction of the picture signal line, a gap between a pixel electrode and the counter electrode is widest when the pixel electrode is located nearest to a specific position to the picture signal line, the specific position being different from either end of the picture signal line in the projection direction of the picture signal line, and the gap becomes narrower as the pixel electrode is located farther away from the specific position to the picture signal line.

(11) The display device according to (10), wherein the specific position to the picture signal line is a median point of both ends of the insulating substrate, the both ends being in the same direction as the projection direction of the picture signal line.

(12) The display device according to (10), wherein the specific position to the picture signal line is a median point of both ends of the picture signal line, the both ends being in the projection direction of the picture signal line concerned.

(13) The display device according to (1) to (12), wherein the display panel is a liquid crystal display panel in which a liquid crystal is enclosed in a space between two substrates, and wherein the insulating substrate which includes the scanning signal lines, the picture signal lines, the TFTs, the pixel electrodes, and the counter electrode, is one of the two substrates.

According to the display device provided by the present invention, in the liquid crystal display panel in which the pixel electrode and the counter electrode in a shape of comb are arranged in an opposing manner, the brightness unevenness produced by the insufficient writing of TFT can be reduced easily.

In the display device provided by the present invention, the brightness unevenness produced by the insufficient writing of TFT can be reduced without converting the scanning signal into a three-level signal, thereby the manufacturing cost of the display device can be reduced.

BRIEF DESCRIPTION OF THE DRAWINGS

FIG. 3B is a schematic sectional view in the line B-B' of FIG. 3A;

FIG. 4E is a schematic sectional view illustrating an example of the sectional shape of TFT of the two pixels SP1 and SP2 illustrated in FIG. 4D;

FIG. 4F is a schematic sectional view illustrating an example of the relationship of pixel electrodes and counter electrodes for the two pixels SP1 and SP2, illustrated in FIG. 4A;

FIG. 11B is a schematic plan view illustrating an example of the relationship of pixel electrodes and counter electrodes for two pixels SP1 and SP2 illustrated in FIG. 11A;

FIG. 14B is a schematic sectional view illustrating an example of the variation in the etching amount in two pixels SP5 and SP6 located in the diagonal of a display area DA illustrated in FIG. 14A.

DETAILED DESCRIPTION OF THE INVENTION

Hereinafter, with reference to the accompanying drawings, the embodiments of the present invention are explained in detail. In all the figures for describing the embodiments, elements which possess the same function are attached with the same symbol, and the repeated explanation thereof is omitted.

Figure 1A:
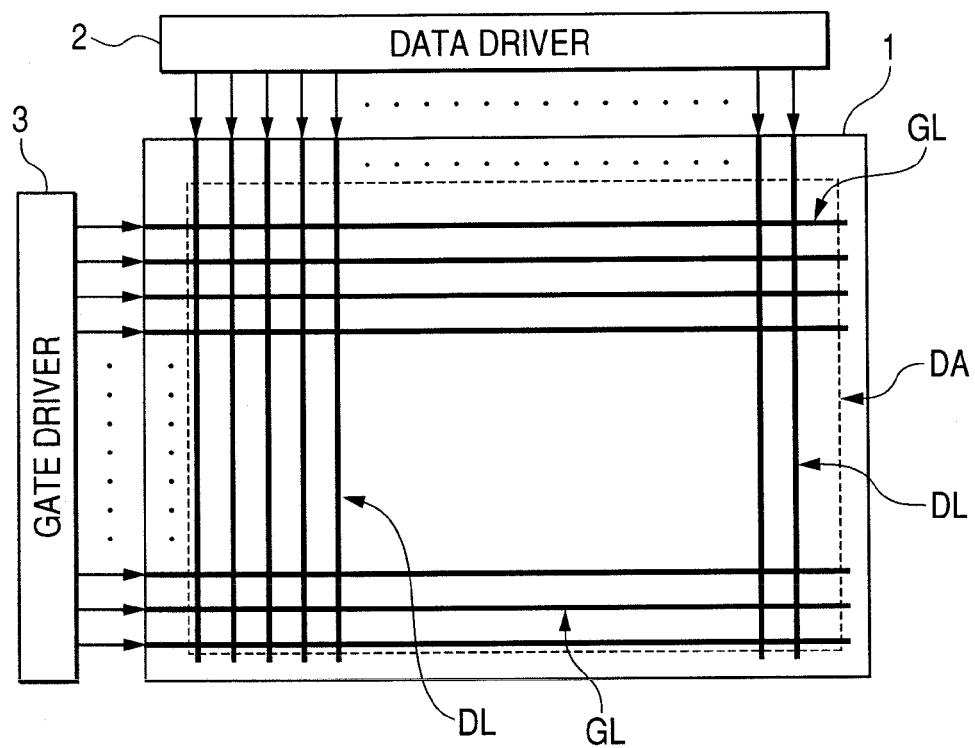
FIG. 1A is a schematic diagram illustrating an example of the outline structure of a liquid crystal display device concerning the present invention.
Figure 1B:
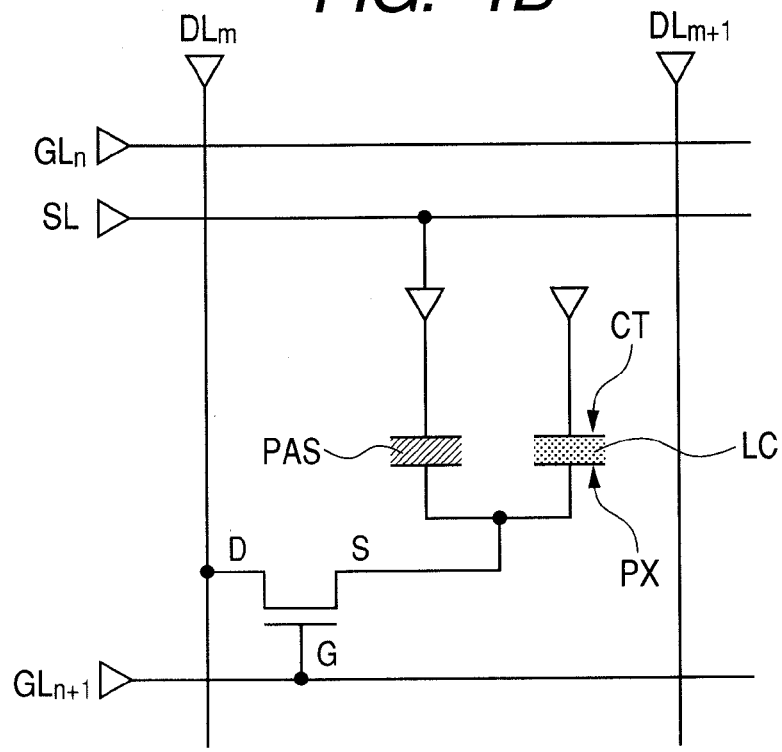
FIG. 1B is a schematic diagram illustrating an example of a circuit of one pixel in the liquid crystal display panel illustrated in FIG. 1A.

FIG. 1A is a schematic diagram illustrating an example of the outline structure of a liquid crystal display device concerning the present invention. FIG. 1B is a schematic diagram illustrating an example of a circuit of one pixel in the liquid crystal display panel illustrated in FIG. 1A.

The present invention is applicable to an active-matrix TFT liquid crystal display device, for example. The active-matrix TFT liquid crystal display device possesses a liquid crystal display panel 1, a data driver 2, and a gate driver 3, for example, as illustrated in FIG. 1A. The data driver 2 is a drive circuit which generates a picture signal (a brightness level voltage signal) to be supplied to plural picture signal lines DL provided in the liquid crystal display panel 1. The gate driver 3 is a drive circuit which generates a scanning signal to be supplied to plural scanning signal lines GL provided in the liquid crystal display panel 1. Although omitted in FIG. 1A, the TFT liquid crystal display device possesses, in addition to these above-described elements, a control circuit or the like to control the operation of the data driver 2 and the gate driver 3, for example. In the case of a transmissive or transflective TFT liquid crystal display device, the TFT liquid crystal display device also possesses a back light unit (light source).

The liquid crystal display panel 1 possesses plural scanning signal lines GL and plural picture signal lines DL, and many pieces of active elements (also called a switching element) arranged in a matrix in the display area DA. The scanning signal lines GL and the picture signal lines DL are formed, by interposing an insulating layer therebetween, and one picture signal line DL intersects with the plural scanning signal lines GL three-dimensionally through the interposed insulating layer. In the liquid crystal display panel 1, the active element is TFT of MIS structure (an MOS structure is included).

The display area DA of the liquid crystal display panel 1 is composed of many pixels arranged in the projection direction of the scanning signal line GL and the projection direction of the picture signal line DL. The area which one pixel occupies is equivalent to the area surrounded by two adjoining picture signal lines DL and two adjoining scanning signal lines GL.

When TFT used as the active element is arranged at a rate of one TFT to one pixel, for example, as illustrated in FIG. 1B, TFT arranged to the area (pixel) surrounded by two adjoining scanning signal lines $GL_n$, $GL_{n+1}$ (n is an integer greater than one) and two adjoining picture signal lines $DL_m$, $DL_{m+1}$ (m is an integer greater than one), possesses the gate (G) coupled to the scanning signal line $GL_{n+1}$, the drain (D) coupled to the picture signal line $DL_m$ and the source (S) coupled to the pixel electrode PX. The pixel electrode PX forms pixel capacity $C_{LC}$ (also called liquid crystal capacity) together with the counter electrode CT (also called a common electrode) and the liquid crystal LC.

A holding capacity line SL, for example, is provided in the liquid crystal display panel 1. In each pixel, the holding capacity (also called auxiliary capacity) is formed by the source electrode coupled to the source of TFT (or the pixel electrode PX), the holding capacity line SL, and an insulating layer PAS sandwiched therebetween.

In the present specification, as for the drain (D) and the source (S) of TFT, the one coupled to the picture signal line DL is called the drain (D) and the one coupled to the pixel electrode PX is called the source (S). Conversely, however, the one coupled to the picture signal line DL may be called a source (S), and the one coupled to the pixel electrode PX may be called a drain (D).

Figure 2A:
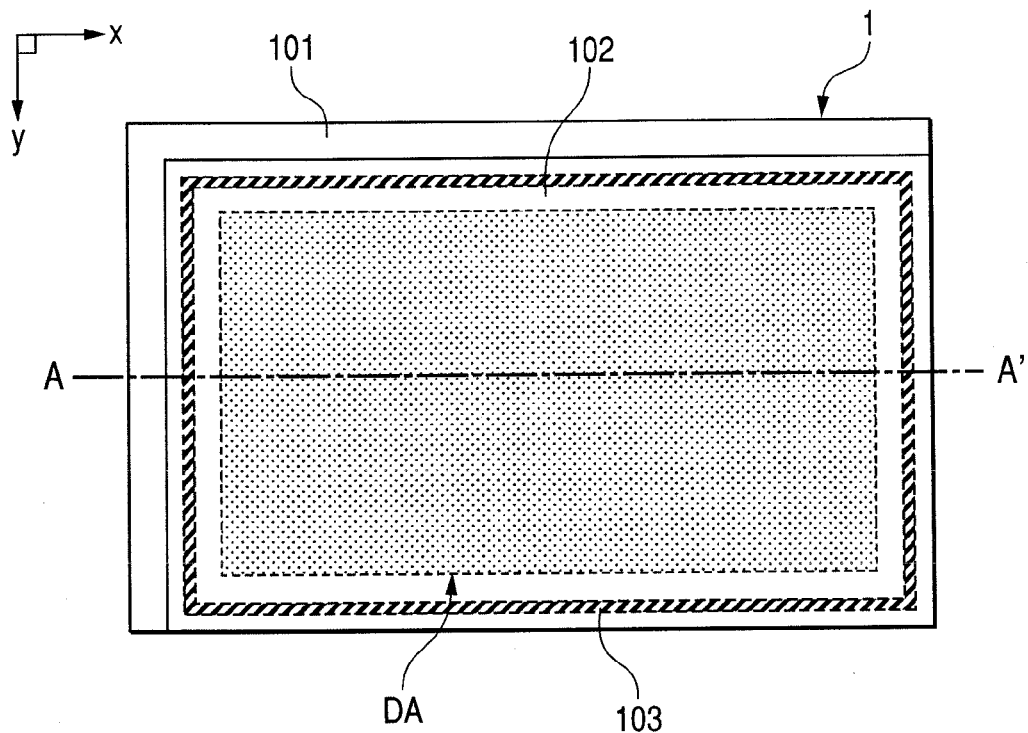
FIG. 2A is a schematic plan view illustrating an example of the outline structure of a liquid crystal display panel.
Figure 2B:
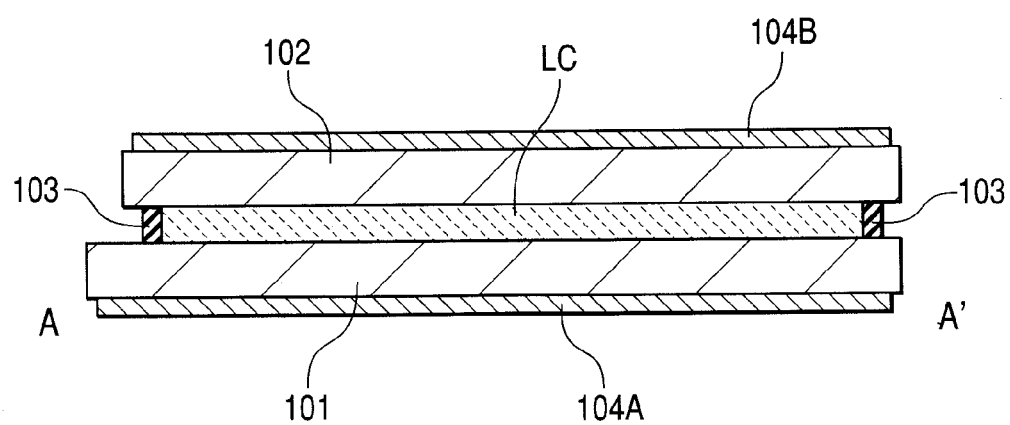
FIG. 2B is a schematic sectional view in the line A-A' of FIG. 2A.

FIG. 2A is a schematic plan view illustrating an example of the outline structure of a liquid crystal display panel. FIG. 2B is a schematic sectional view in the line A-A' of FIG. 2A.

Figure 3A:
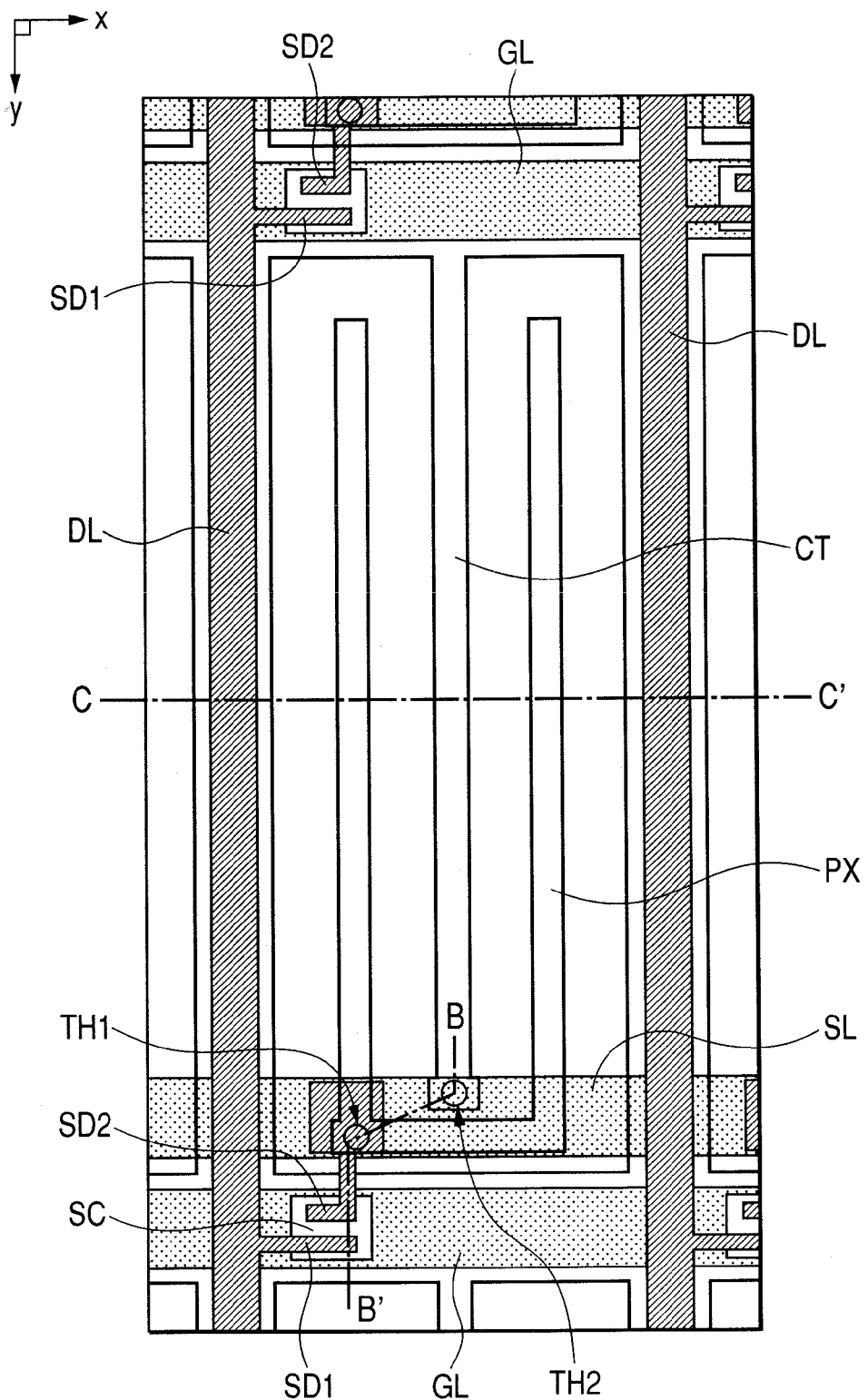
FIG. 3A is a schematic plan view illustrating an example of the structure of one pixel in a TFT substrate of the liquid crystal display panel according to one example of the present invention.
Figure 3C:
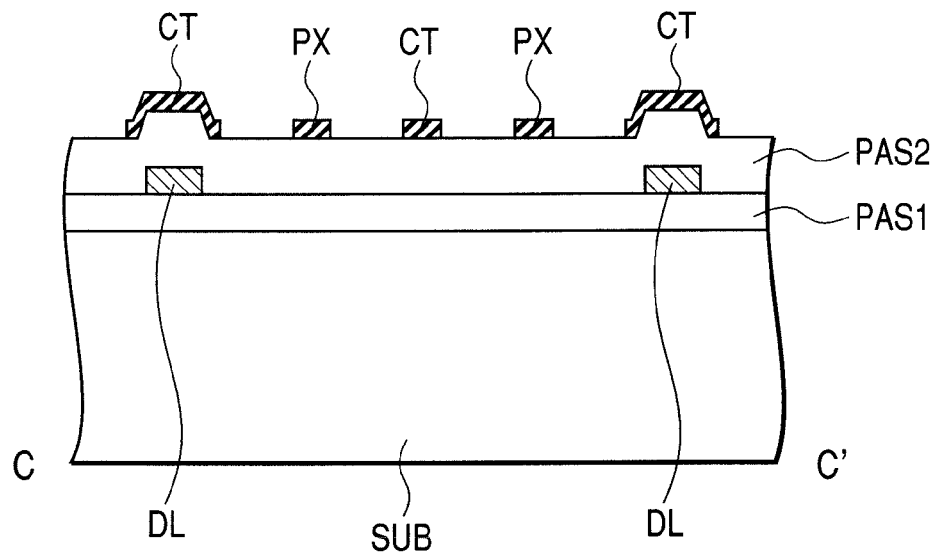
FIG. 3C is a schematic sectional view in the line C-C' of FIG. 3A.

FIG. 3A is a schematic plan view illustrating an example of the structure of one pixel in a TFT substrate of the liquid crystal display panel according to one example of the present invention. FIG. 3B is a schematic sectional view in the line B-B' of FIG. 3A. FIG. 3C is a schematic sectional view in the line C-C' of FIG. 3A.

The liquid crystal display panel 1 has, as illustrated in FIG. 2A and FIG. 2B for example, a liquid crystal LC enclosed between a pair of substrates called a TFT substrate 101 and a counter substrate 102. At this time, the TFT substrate 101 and the counter substrate 102 are pasted up by an annular seal member 103 surrounding the display area DA, and the liquid crystal LC is enclosed in the space surrounded by the TFT substrate 101, the counter substrate 102, and the seal member 103.

When the liquid crystal display panel 1 is transmissive or transflective, a pair of polarizing plates 104A, 104B, for example, is provided overlying the outward surface of the TFT substrate 101 and the counter substrate 102. At this time, for example, one or more layers of a phase difference plate may be provided between the TFT substrate 101 and the polarizing plate 104A, and between the counter substrate 102 and the polarizing plate 104B, respectively.

When the liquid crystal display panel 1 is reflective, the polarizing plate 104A and the phase difference plate on the side of the TFT substrate 101 are generally unnecessary.

The present invention is applied to the liquid crystal display panel 1 in which the pixel electrode PX and the counter electrode CT which drive the liquid crystal LC are provided in the TFT substrate 101, and the pixel electrode PX and the counter electrode CT are arranged in an opposing manner over the same surface of the insulating layer.

At this time, the structure of one pixel in the TFT substrate 101 is, for example, like one as illustrated in FIG. 3A to FIG. 3C. A scanning signal line GL and a holding capacity line SL, a first insulating layer PAS1, a semiconductor layer SC, a picture signal line DL and a drain electrode SD1 and a source electrode SD2, a second insulating layer PAS2, a pixel electrode PX and a counter electrode CT are respectively laminated over the surface of an insulating substrate SUB, such as a glass substrate. The pixel electrode PX is coupled to the source electrode SD2 by a through-hole TH1, and the counter electrode CT is coupled to the holding capacity line SL by a through-hole TH2.

The scanning signal line GL and the holding capacity line SL are conductive layers which are formed by etching a first conducting film composed of a metal such as aluminum, for example. The holding capacity line SL is formed between every two adjoining scanning signal lines GL, and the holding capacity lines SL are connected each other on the outside of the display area DA, for example, thereby providing one integral structure.

The semiconductor layer SC, provided over the scanning signal line GL through the intermediate of the first insulating layer PAS1, is a semiconductor layer which is formed by etching a semiconductor film of amorphous silicone, for example; thereby functioning as a semiconductor layer of TFT. At this time, the semiconductor layer SC possesses three regions: a drain region, a source region, and a channel region.

The first insulating layer PAS1 is an insulating layer formed by a silicon oxide, for example, and functions as a gate insulating film of TFT.

The picture signal line DL, the drain electrode SD1, and the source electrode SD2 are conductive layers which are formed by etching a second conducting film made of a metal such as aluminum, for example. At this time, the drain electrode SD1 is integrally formed with the picture signal line DL, for example. At the same time, the source electrode SD2 is extended in the projection direction (the y direction) of the picture signal line DL, and possesses a section overlapping with the holding capacity line SL when viewed in a plane. As a result, the holding capacity is formed in the section where the source electrode SD2 and the holding capacity line SL overlaps when viewed in a plane.

The plane described above is the plane illustrated in FIG. 3A, i.e., the plane when the TFT substrate 101 (the liquid crystal display panel 1) is viewed from the observer side. Other planes which will be referred to in the explanation of the present specification are also the plane illustrated in FIG. 3A, i.e., the plane when the TFT substrate 101 (the liquid crystal display panel 1) is viewed from the observer side.

The pixel electrode PX and the counter electrode CT, provided through the intermediate of the second insulating layer PAS2 over the surface in which the picture signal line DL etc. are formed, are the conductive layers which are formed by etching a third conducting film made of a conductive material with high light-transmittance, such as ITO, for example. At this time, the pixel electrode PX and the counter electrode CT possess a plane shape called a shape of comb, for example, and when one pixel is viewed in the projection direction (the x direction) of the scanning signal line GL, the pixel electrode PX and the counter electrode CT are formed so that they may be placed alternately.

Although omitted in FIG. 3B and FIG. 3C, over the surface in which the pixel electrode PX is formed, an orienting film is formed, for example. As for the TFT substrate 101, the surface in which the orienting film is formed faces the counter substrate 102 through the liquid crystal layer LC.

Although detailed explanation will be omitted, the counter substrate 102 possesses an insulating substrate, such as a glass substrate, and over the surface of the insulating substrate, a light shielding layer which divides the display area DA into a pixel-unit region, a color filter, an orientation film, or the like are formed, for example.

Hereinafter, taking as an example the TFT substrate 101 in which the structure of one pixel in the display area DA is same as illustrated in FIG. 3A to FIG. 3C, the feature of the structure when the present invention is applied is explained.

Embodiment 1

FIG. 4A to FIG. 4F are schematic diagrams for explaining an example of the outline structure of the TFT substrate according to Embodiment 1 of the present invention.

Figure 4A:
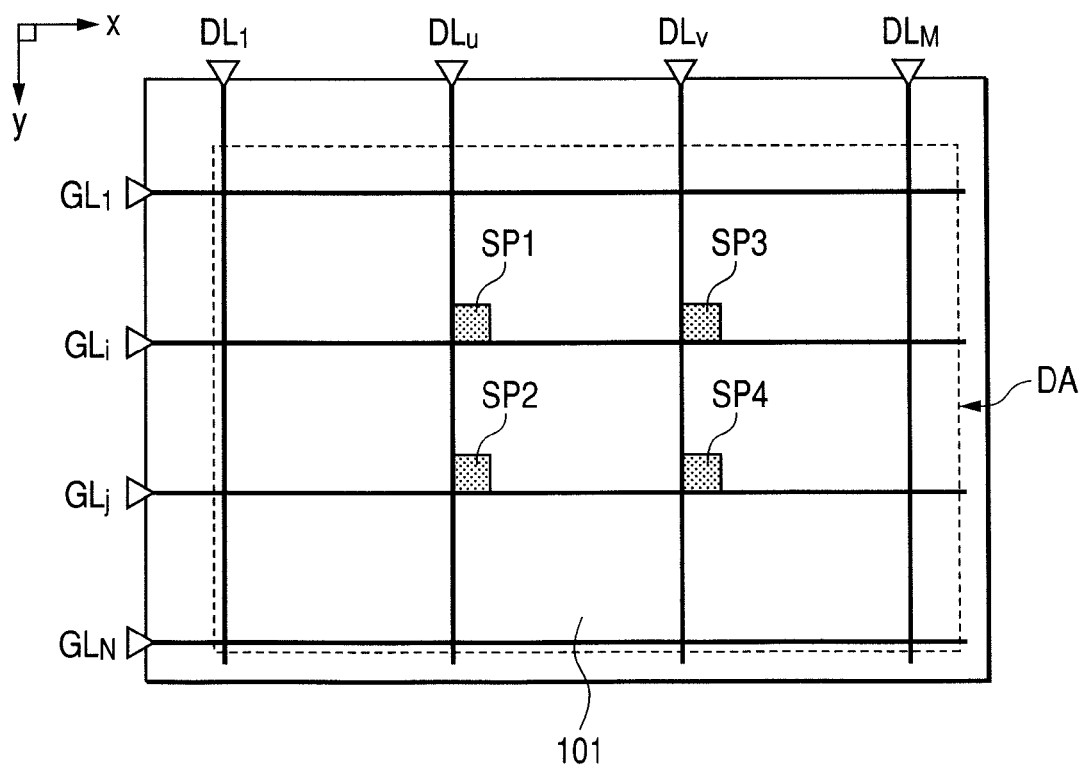
FIG. 4A is a schematic plan view illustrating the spatial relationship of four pixels referred to in explaining the feature of the TFT substrate according to Embodiment 1.
Figure 4B:
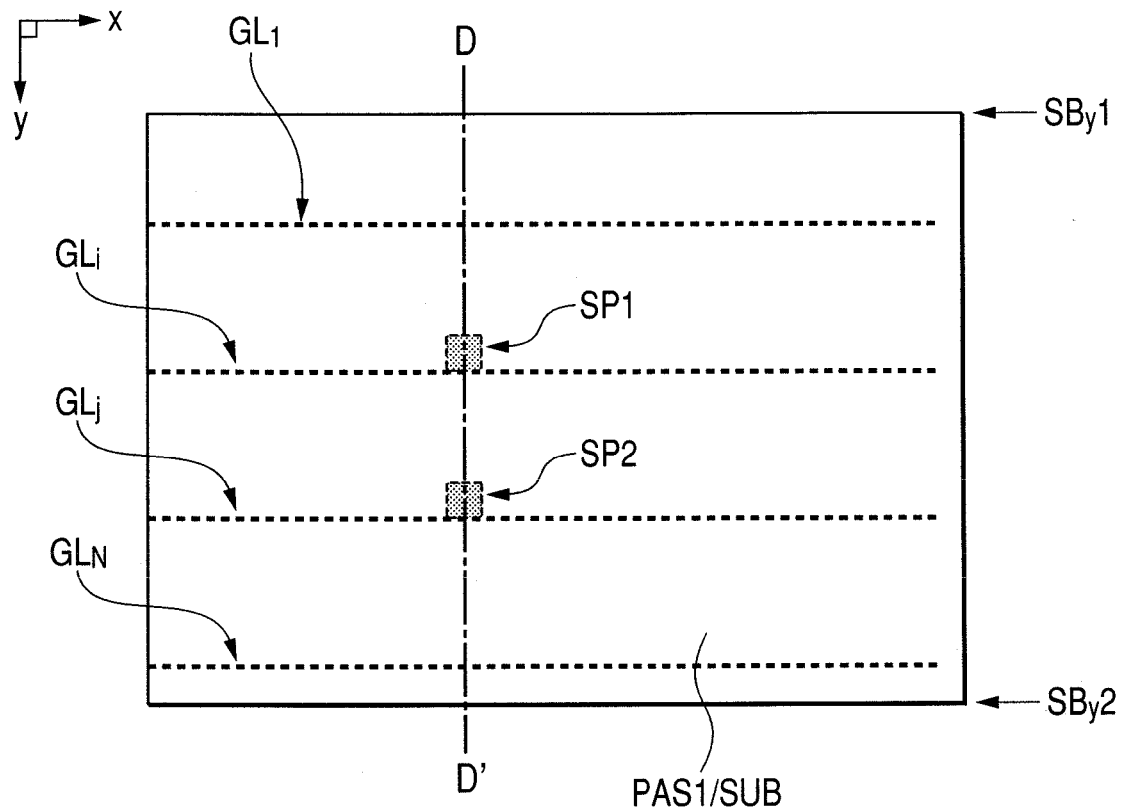
FIG. 4B is a schematic plan view of an insulating substrate immediately after a first insulating layer is formed.
Figure 4C:
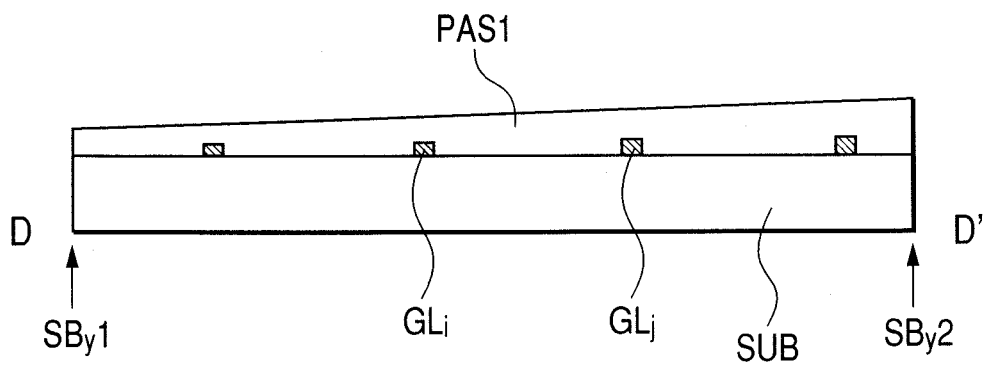
FIG. 4C is a schematic sectional view illustrating an example of the cross-section structure in the line D-D' of FIG. 4B.
Figure 4D:
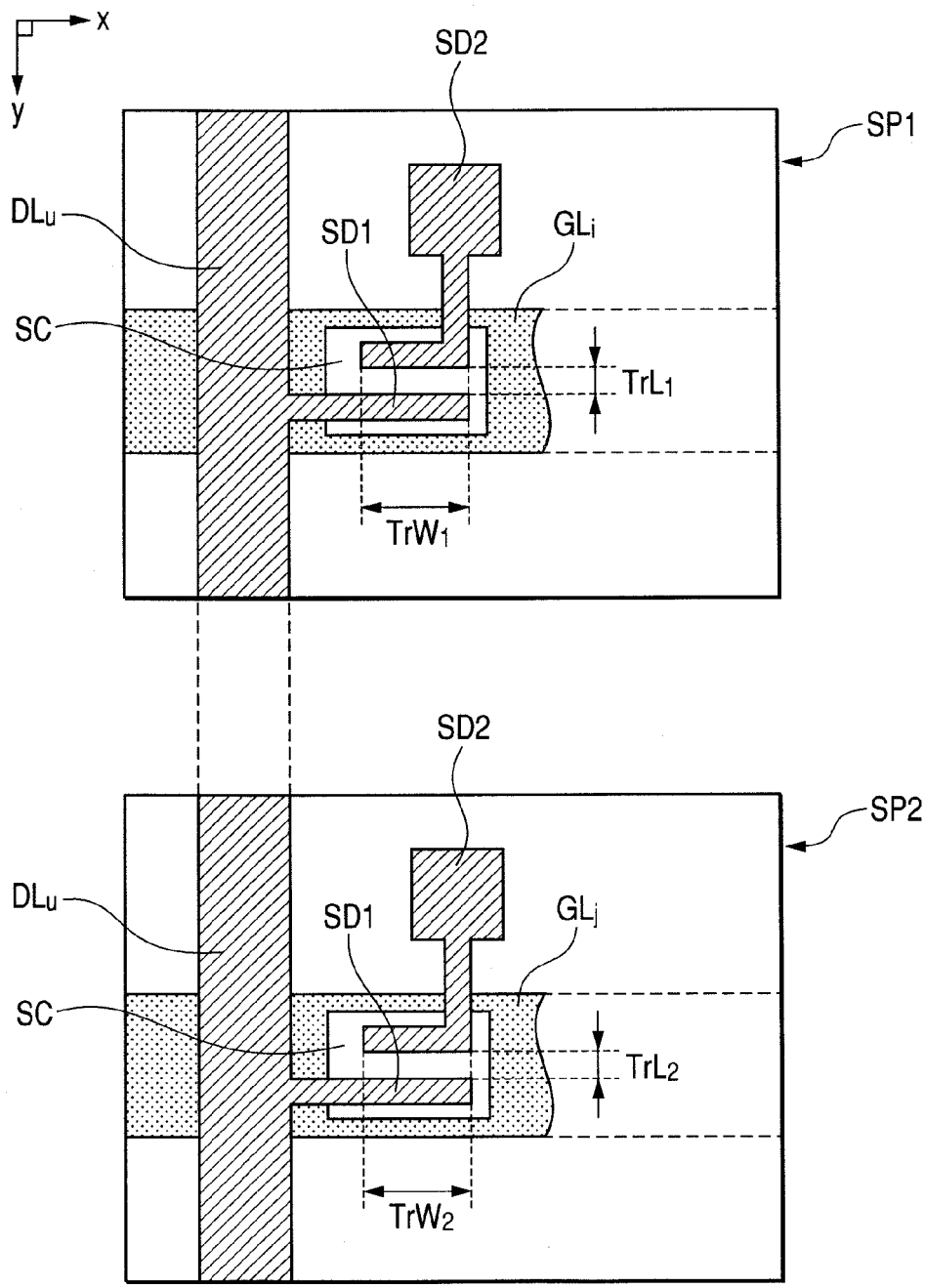
FIG. 4D is a schematic plan view illustrating an example of the plane shape of TFT of the two pixels SP1 and SP2 illustrated in FIG. 4A.

FIG. 4A is a schematic plan view illustrating the spatial relationship of four pixels referred to in explaining the feature of the TFT substrate in Embodiment 1. FIG. 4B is a schematic plan view of an insulating substrate immediately after a first insulating layer is formed. FIG. 4C is a schematic sectional view illustrating an example of the cross-section structure in the line D-D' of FIG. 4B. FIG. 4D is a schematic plan view illustrating an example of the plane shape of TFT of the two pixels SP1 and SP2 illustrated in FIG. 4A. FIG. 4E is a schematic sectional view illustrating an example of the sectional shape of TFT of the two pixels SP1 and SP2 illustrated in FIG. 4D. FIG. 4F is a schematic sectional view illustrating an example of the relationship of pixel electrodes and counter electrodes for the two pixels SP1 and SP2, illustrated in FIG. 4A.

FIG. 4D is a plan view illustrating only the structure of TFT necessary for explaining the feature of the TFT substrate of Embodiment 1, and the holding capacity line SL is omitted from the plan view. FIG. 4E is a sectional view of TFT of each pixel in the y direction, illustrating only the section of TFT out of the sectional view illustrated in FIG. 3B.

In explaining the structure in the case of applying the present invention to the TFT substrate 101 possessing a structure illustrated in FIG. 3A to FIG. 3C, Embodiment 1 refers to a first pixel SP1, a second pixel SP2, a third pixel SP3, and a fourth pixel SP4, for example, as illustrated in FIG. 4A.

The first pixel SP1 is a pixel which possesses TFT in which the gate is coupled to the scanning signal line $GL_i$, and the drain is coupled to the picture signal line $DL_u$. The second pixel SP2 is a pixel which possesses TFT in which the gate is coupled to the scanning signal line $GL_j$, and the drain is coupled to the picture signal line $DL_u$. The third pixel SP3 is a pixel which possesses TFT in which the gate is coupled to the scanning signal line $GL_j$, and the drain is coupled to the picture signal line $DL_v$. The fourth pixel SP4 is a pixel which possesses TFT in which the gate is coupled to the scanning signal line $GL_j$, and the drain is coupled to the picture signal line $DL_v$.

When manufacturing the TFT substrate 101 of structure illustrated in FIG. 3A to FIG. 3C, plural scanning signal lines GL and a holding capacity line SL are first formed over the surface of the insulating substrate SUB, such as a glass substrate. Next, an insulating layer PAS1 which possesses function as a gate insulating film of each TFT is formed. Next, a semiconductor layer SC is formed. Next, a picture signal line DL (including a drain electrode SD1) and a source electrode SD2 are formed. Next, a second insulating layer PAS2 is formed. Finally a pixel electrode PX and a counter electrode CT are formed.

At this time, when the cross section in the y direction which passes through the first pixel SP1 and the second pixel SP2 is viewed as illustrated in FIG. 4B, as for the insulating substrate SUB which up to the first insulating layer PAS1 has been formed, it may occasionally happen, as illustrated in FIG. 4C, that the first insulating layer PAS1 is formed such that the thickness thereof changes monotonically as it becomes thicker from one end SBy1 to the other end SBy2 of both ends of the first insulating layer PAS1 in the y direction.

In the conventional general TFT manufacturing method, the plane shapes of all the TFTs (active elements) including TFT of the first pixel SP1 and TFT of the second pixel SP2 are formed so that they may have the same shape. Therefore, in the plane shape of TFT of the first pixel SP1 and in the plane shape of TFT of the second pixel SP2, for example, as illustrated in FIG. 4D, the value $(TrW_1/TrL_1)$ that is the channel width $TrW_1$ divided by the channel length $TrL_1$ in TFT of the first pixel SP1 becomes almost same as the value $(TrW_2/TrL_2)$ that is the channel width $TrW_2$ divided by the channel length $TrL_2$ in TFT of the second pixel SP2.

However, when the thickness of the first insulating layer PAS1 changes as illustrated in FIG. 4C, the shape of cross section of TFT of the first pixel SP1, and the shape of cross section of TFT of the second pixel SP2 turn to be, for example, as illustrated in FIG. 4E, resulting in the fact that the film thickness $GID_1$ of the gate insulating film (the first insulating layer PAS1) in TFT of the first pixel SP1 is thinner than the film thickness $GID_2$ of the gate insulating film (the first insulating layer PAS1) in the second TFT of pixel SP2.

That is, even though TFT of the first pixel SP1 and TFT of the second pixel SP2 are same with respect to the plane shape (size), they are different with respect to the thickness of the gate insulating film. Therefore, a difference arises in the write current value of TFT of the first pixel SP1 and the write current value of TFT of the second pixel SP2, and the write current value of TFT of the second pixel SP2 with a thicker gate insulating film becomes smaller.

In this way, when a difference arises in the write current value of TFT of the first pixel SP1 and the write current value of TFT of the second pixel SP2, due to the difference in the thickness of the gate insulating film, the TFT substrate 101 according to Embodiment 1 is made so that the brightness of the first pixel SP1 and the brightness of the second pixel SP2 may become the almost same brightness, by changing the gap between the pixel electrode PX and the counter electrode CT. The above expression "the almost same brightness" naturally means that the brightness turns into the almost same brightness when writing in and displaying a picture signal (brightness level voltage signal) of the same brightness on the pixel electrode of the first pixel SP1 and on the pixel electrode of the second pixel SP2.

That is, when the relationship between TFT of the first pixel SP1 and TFT of the second pixel SP2 is like the relationship as illustrated in FIG. 4D and FIG. 4E, the pixel electrode PX and the counter electrode CT of the pixels SP1 and SP2 are formed as follows. That is, for example, as illustrated in FIG. 4F, assuming that the gap between the pixel electrode PX and the counter electrode CT in the first pixel SP1 is defined as $Lg1_1$, $Lg2_1$, $Lg3_1$, and $Lg4_1$ in the order from the side of the picture signal line $DL_u$, and that the gap between the pixel electrode PX and the counter electrode CT in the second pixel SP2 is defined as $Lg1_2$, $Lg2_2$, $Lg3_2$, and $Lg4_2$ in the order from the side of the picture signal line $DL_u$, the pixel electrode PX and the counter electrode CT of each of the pixels SP1 and SP2 are formed so that these gaps should satisfy the following relationship: $Lg1_1 > Lg1_2$, $Lg2_1 > Lg2_2$, $Lg3_1 > Lg3_2$, and $Lg4_1 > Lg4_2$.

It is made for such relationship to be satisfied not only for example between the first pixel SP1 and the second pixel SP2, but also for example between the third pixel SP3 and the fourth pixel SP4 which are illustrated in FIG. 4A. Furthermore, it is made for such relationship to be satisfied also between the first pixel SP1 and the third pixel SP3 and between the second pixel SP2 and the fourth pixel SP4.

Furthermore, the TFT substrate 101 according to Embodiment 1 is made so that, not only when two pixels are chosen out of the four pixels SP1 SP2, SP3, and SP4 illustrated in FIG. 4A, but also when two pixels are chosen arbitrarily out of all the pixels in the display area DA, if the film thickness of the gate insulating film of TFT of the two pixels concerned has a difference, the gap between the pixel electrode PX and the counter electrode CT in the pixel of which the thickness of the gate insulating film is thicker will be made narrower than the gap between the pixel electrode PX and the counter electrode CT in the pixel of which the thickness of the gate insulating film is thinner.

When the pixel electrode PX and the counter electrode CT is placed oppositely over the same surface of the second insulating layer PAS2, like the TFT substrate 101 of Embodiment 1, the molecule of the liquid crystal LC is driven by the electric field produced in the gap section between the pixel electrode PX and the counter electrode CT. If the potential difference between the pixel electrode PX and the counter electrode CT is the same at this time, the narrower gap between the pixel electrode PX and the counter electrode CT induces stronger electric field, producing greater power in driving the molecule of the liquid crystal LC. Therefore, the brightness unevenness arising from the difference in the write current value of TFT can be reduced by narrowing the gap between the pixel electrode PX and the counter electrode CT of the pixel for which the write current value of TFT is smaller.

Figure 5:
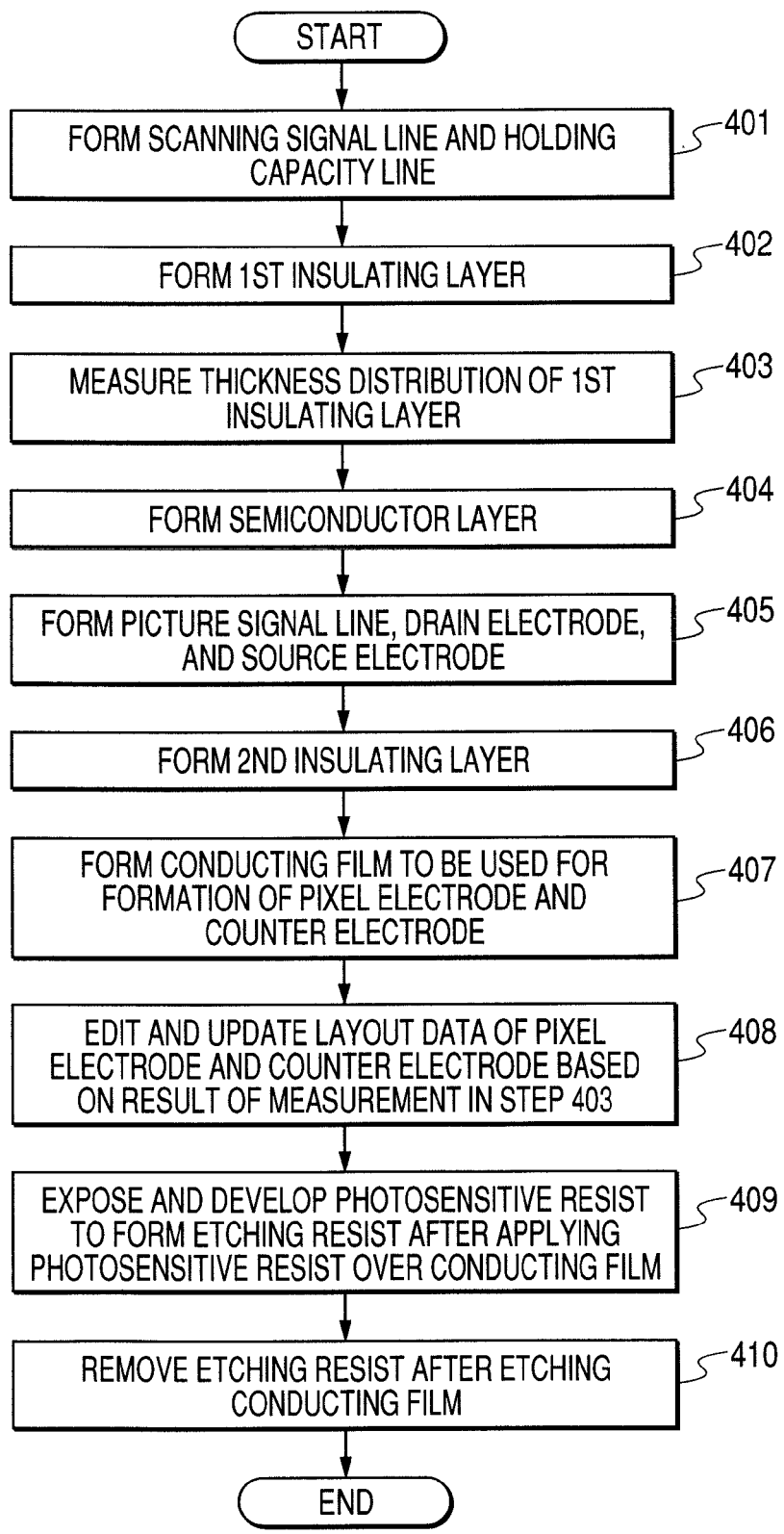
FIG. 5 is a schematic flow chart for explaining an example of the manufacturing method of the TFT substrate according to Embodiment 1.

FIG. 5 is a schematic flow chart for explaining an example of the manufacturing method of the TFT substrate according to Embodiment 1.

When manufacturing the TFT substrate 101 according to Embodiment 1, as illustrated in FIG. 5, a scanning signal line GL and a holding capacity line SL are first formed over the surface of an insulating substrate SUB, such as a glass substrate (Step 401). Next, a first insulating layer PAS1 which possesses the function as a gate insulating film of TFT is formed (Step 402). Step 401 and Step 402 may follow respectively the same procedure as the process of forming the scanning signal line GL and the holding capacity line SL and the process of forming the first insulating layer PAS1, in the conventional manufacturing method of the TFT substrate; therefore, the detailed explanation thereof is omitted.

Next, the thickness distribution of the first insulating layer PAS1 is measured (Step 403). In Step 403, the measurement is performed using, for example, an ellipsometer, for the film thickness of the first insulating layer PAS1 in the position where TFT of each pixel is formed. When measuring the film thickness, for example, the film thickness in all the positions where TFTs are formed may be measured, or alternatively, dividing the whole region into some sub-regions, the film thickness only in a representative point of each sub-region may be measured, and it may be regarded that the film thickness in several positions where TFTs are formed in each sub-region is equal to the film thickness in the representative point of the sub-region.

Next, a semiconductor layer SC is formed (Step 404). Next, a picture signal line DL, a drain electrode SD1, and a source electrode SD2 are formed (Step 405). Next, a second insulating layer PAS2 is formed (Step 406). Step 404, Step 405 and Step 406 may follow respectively the same procedure as the process of forming the semiconductor layer SC, the process of forming the picture signal line DL and the drain electrode SD1 and the source electrode SD2, and the process of forming the second insulating layer PAS2, in the conventional manufacturing method of the TFT substrate; therefore, detailed explanation thereof is omitted.

Next, a conducting film (for example, ITO film) to be used for formation of a pixel electrode PX and a counter electrode CT is formed (Step 407).

Next, based on the result of the measurement in Step 403, the layout data (plane size) of the pixel electrode PX and the counter electrode CT are edited and updated (Step 408). In Step 408, as illustrated in FIG. 4F, for example, the plane size of the pixel electrode PX and the plane size of the counter electrode CT are updated so that the gap between the pixel electrode PX and the counter electrode CT of a pixel with a thinner gate insulating film of TFT should become wider and that the gap between the pixel electrode PX and the counter electrode CT of a pixel with a thicker gate insulating film of TFT should become narrower. Although Step 408 is performed after Step 407 in the example illustrated in FIG. 5, the stage of Step 408 is not limited to the case. Step 408 may be performed in any stage, of course, as long as it is performed after Step 403 and before the next Step 409.

Next, after applying a photosensitive resist over the conducting film formed at Step 407, the photosensitive resist concerned is exposed and developed and the etching resist is formed (Step 409). When exposing the photosensitive resist at Step 409, a photolithography machine called a direct imaging machine, for example, is used. The direct imaging machine is a photolithography machine which for example, divides the photosensitive resist into many small areas, judges whether each small area is to be exposed or not, based on the layout data (size numerical data) created by CAD etc., and exposes, sequentially or collectively, only the small areas which have been judged to be exposed. At this time, the direct imaging machine distinguishes the region to be exposed and the region not to be exposed, based on the layout data of the pixel electrode PX and the counter electrode CT updated at Step 408, for example.

When the direct imaging machine is used, an exposure pattern (region to expose) can be changed simply by changing the numerical value of the layout data to be used. Therefore, even in a case where the degree of the change of the film thickness of the first insulating layer PAS1 differ for every TFT substrate 101, the exposure can be performed quickly and flexibly. Since the exposure mask, which is conventionally used by the ordinary photolithography machine, is unnecessary in the direct imaging machine, a manufacturing cost can be reduced.

Next, after etching the conducting film with a mask of the etching resist formed at Step 409, the etching resist is exfoliated (removed), to form the pixel electrode PX and the counter electrode CT (Step 410).

The TFT substrate 101 according to Embodiment 1 is obtained by the above procedure.

In this way, in the TFT substrate 101 of Embodiment 1, when a difference arises in the film thickness of the gate insulating film of each TFT in the manufacturing process of the TFT substrate 101, the gap between the pixel electrode PX and the counter electrode CT of each pixel is changed in accordance with the difference; thereby, the brightness unevenness of the liquid crystal display device arising from the difference in the film thickness of the gate insulating film of each TFT can be reduced easily.

In the above-mentioned explanation of the manufacturing method following FIG. 5, the use of the direct imaging machine is exemplified for exposing the photosensitive resist at Step 409. However, when exposing the photosensitive resist at Step 409, it is also possible to perform the exposure, for example, using an exposure mask in which the exposure pattern is formed with a light-shielding layer, such as chromium (Cr), on the surface of a transparent substrate, such as a glass substrate. In that case, what is necessary is to prepare an exposure mask using the layout data of the pixel electrode PX and the counter electrode CT, updated based on the change of the film thickness of the first insulating layer PAS1 in a TFT substrate 101 which is manufactured by way of trial, for example, and to perform the exposure using the exposure mask concerned.

By the way, it is very rare that the change of the film thickness of the first insulating layer PAS1 produced in manufacturing the TFT substrate 101 occurs at random for every TFT substrate 101. The change can be rather classified into some patterns corresponding to the manufacturing method of the TFT substrate 101. Hereinafter, an example of the pattern (tendency) of the relationship between the manufacturing method of the TFT substrate 101 and the thickness distribution of the insulating layer is explained.

Figure 6A:
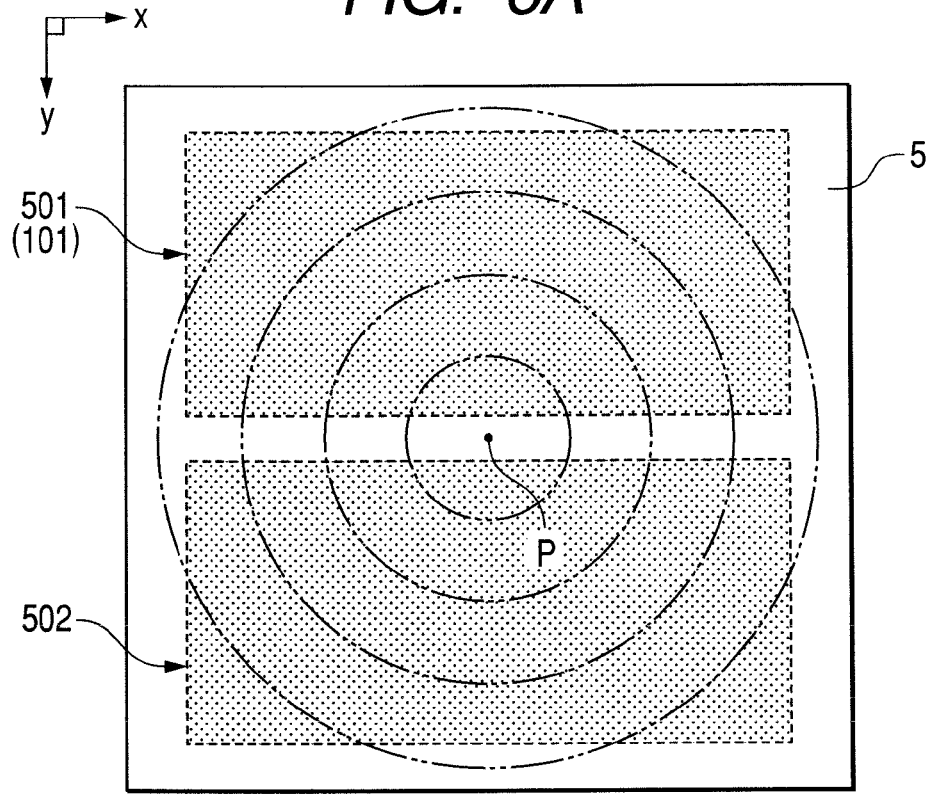
FIG. 6A is a schematic plan view illustrating the thickness distribution of an insulator layer in the case of cutting out 2 sheets of TFT substrates from one sheet of mother glass.
Figure 6B:
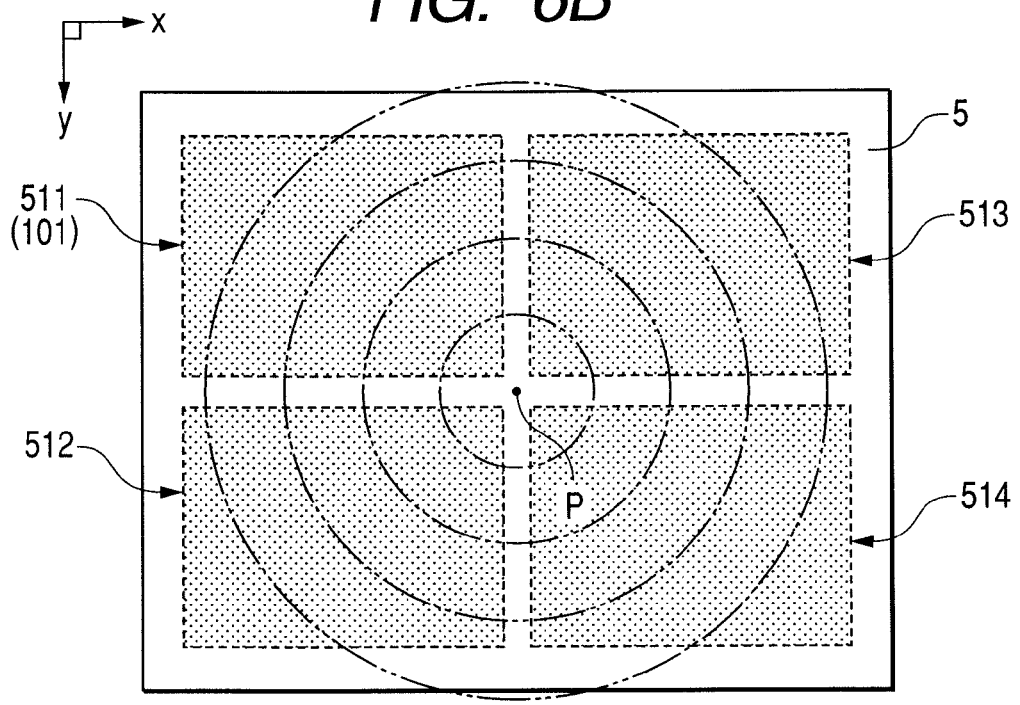
FIG. 6B is a schematic plan view illustrating the thickness distribution of an insulator layer in the case of cutting out 4 sheets of TFT substrates from one sheet of mother glass.
Figure 6C:
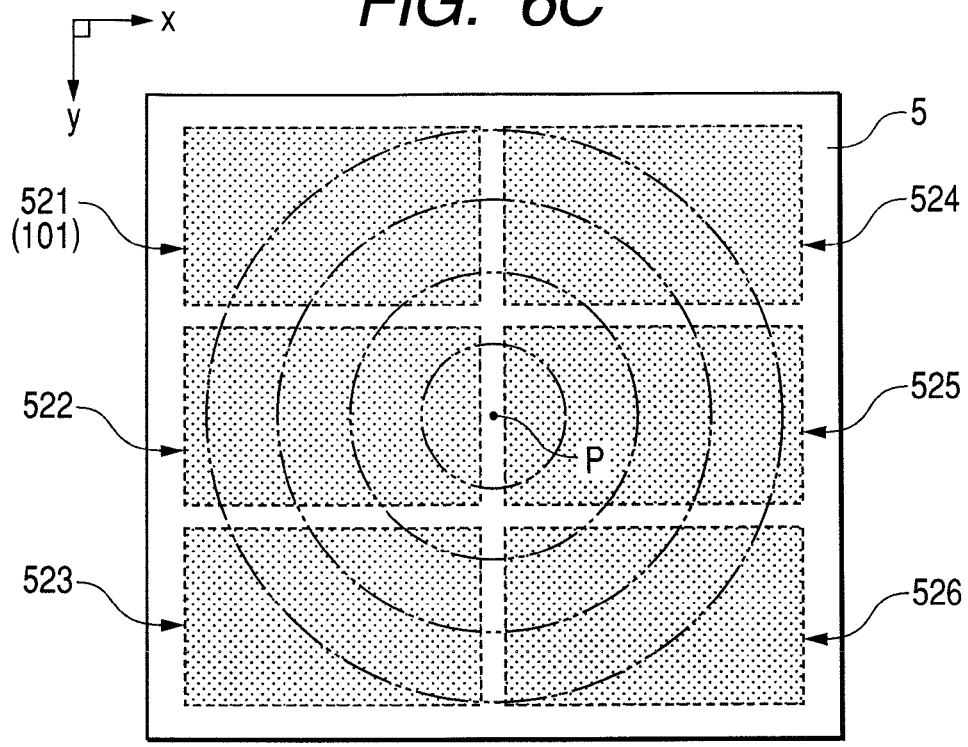
FIG. 6C is a schematic plan view illustrating the thickness distribution of an insulator layer in the case of cutting out 6 sheets of TFT substrates from one sheet of mother glass.
Figure 6D:
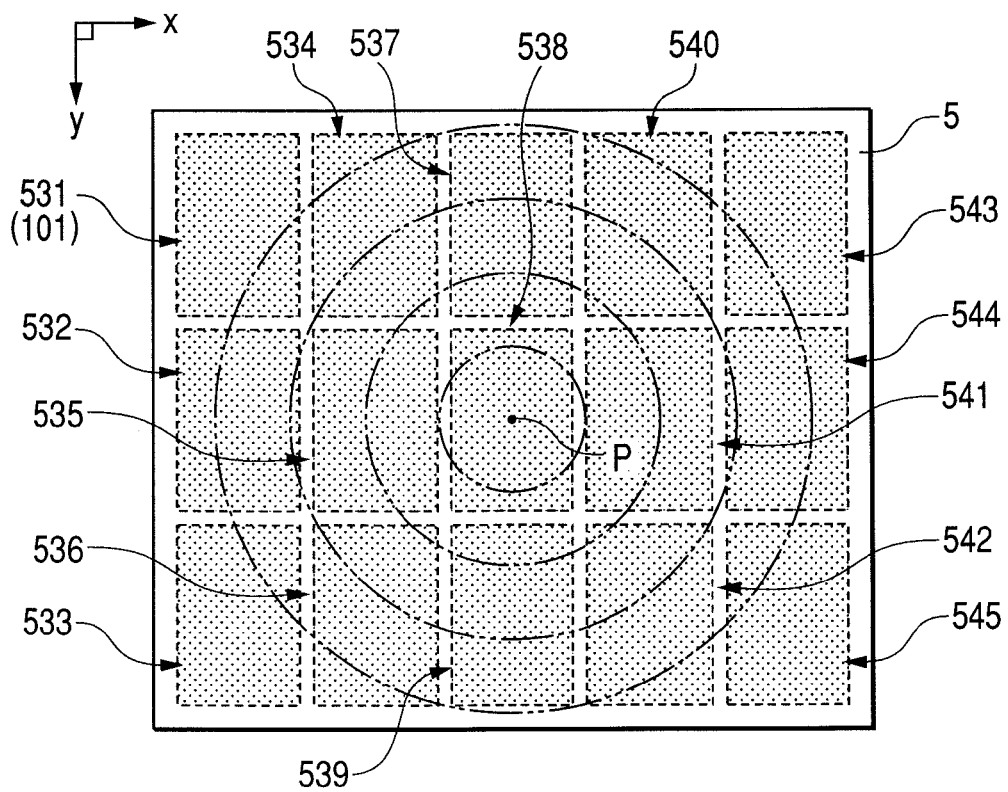
FIG. 6D is a schematic plan view illustrating the thickness distribution of an insulator layer in the case of cutting out 15 sheets of TFT substrates from one sheet of mother glass.

FIG. 6A is a schematic plan view illustrating the thickness distribution of an insulator layer in the case of cutting out 2 sheets of TFT substrates from one sheet of mother glass. FIG. 6B is a schematic plan view illustrating the thickness distribution of an insulator layer in the case of cutting out 4 sheets of TFT substrates from one sheet of mother glass. FIG. 6C is a schematic plan view illustrating the thickness distribution of an insulator layer in the case of cutting out 6 sheets of TFT substrates from one sheet of mother glass. FIG. 6D is a schematic plan view illustrating the thickness distribution of an insulator layer in the case of cutting out 15 sheets of TFT substrates from one sheet of mother glass.

Currently, the TFT substrate 101 used for the liquid crystal display panel 1 is manufactured in such a way that plural sheets of TFT substrates 101 are collectively prepared using one glass substrate of a large area called a mother glass, for example, and subsequently cut out to a sheet of the TFT substrate 101.

In the case of what is called 2 panels per mother glass production that two sheets of TFT substrates 101 are cut out from one sheet of mother glass, as illustrated in FIG. 6A, there are two regions 501, 502 to be cut as a TFT substrate 101 in the mother glass 5, for example. In each of the two regions 501, 502, the TFT substrate 101 in which one pixel possesses the structure as illustrated in FIG. 3A to FIG. 3C, is formed. After forming the TFT substrate 101, two regions 501, 502 are cut from the mother glass 5, and two sheets of TFT substrates 101 are obtained.

In the case of the 2 panels per mother glass production, when forming the first insulating layer PAS1 in two regions 501, 502 of the mother glass 5, for example, the insulator layer is usually formed (film formation) in whole area of the mother glass 5. At this time, the thickness distribution of the insulator layer formed in whole area of the mother glass 5 is expressed, for example, by concentric circles centering on the center P of the mother glass 5, as illustrated with the two-dot chain lines in FIG. 6A. The thickness distribution has such a distribution that the film is thickest at the center P and its neighborhood and becomes gradually thinner as apart from the center P. This is because, for example, a plasma CVD method is employed when forming the insulator layer.

In the case of what is called 4 panels per mother glass production that four sheets of TFT substrates 101 are cut out from one sheet of mother glass, as illustrated in FIG. 6B, there are four regions 511, 512, 513, 514 to be cut as a TFT substrate 101 in the mother glass 5, for example. In each of four regions 511 to 514, the TFT substrate 101 in which one pixel possesses the structure as illustrated in FIG. 3A to FIG. 3C, is formed. After forming TFT substrate 101, four regions 511 to 514 are cut from the mother glass 5, and four sheets of TFT substrate 101 are obtained.

Also in the case of the 4 panels per mother glass production, when forming the first insulating layer PAS1 in four regions 511 to 514 of the mother glass 5, for example, the insulator layer is usually formed in whole area of the mother glass 5. Therefore, the thickness distribution of the insulator layer formed in whole area of the mother glass 5 is expressed, for example, by concentric circles centering on the center P of the mother glass 5, as illustrated with the two-dot chain lines in FIG. 6B. The thickness distribution has such a distribution that the film is thickest at the center P and its neighborhood and becomes gradually thinner as apart from the center P.

In the case of what is called 6 panels per mother glass production that six sheets of TFT substrates 101 are cut out from one sheet of mother glass, as illustrated in FIG. 6C, there are six regions 521, 522, 523, 524, 525, 526 to be cut as a TFT substrate 101 in the mother glass 5, for example. In each of six regions 521 to 526, the TFT substrate 101 in which one pixel possesses the structure as illustrated in FIG. 3A to FIG. 3C, is formed. After forming TFT substrate 101, six regions 521 to 526 are cut from the mother glass 5, and six sheets of TFT substrate 101 are obtained.

Also in the case of the 6 panels per mother glass production, when forming the first insulating layer PAS1 in six regions 521 to 526 of the mother glass 5, for example, the insulator layer is usually formed in whole area of the mother glass 5. Therefore, the thickness distribution of the insulator layer formed in whole area of the mother glass 5 is expressed, for example, by concentric circles centering on the center P of the mother glass 5, as illustrated with the two-dot chain lines in FIG. 6C. The thickness distribution has such a distribution that the film is thickest at the center P and its neighborhood and becomes gradually thinner as apart from the center P.

In the case of what is called 15 panels per mother glass production that 15 sheets of TFT substrates 101 are cut out from one sheet of mother glass, as illustrated in FIG. 6D, there are 15 regions 531, 532, 533, 534, 535, 536, 537, 538, 539, 540, 541, 542, 543, 544, 545 to be cut as a TFT substrate 101 in the mother glass 5, for example. In each of 15 regions 531 to 545, the TFT substrate 101 in which one pixel possesses the structure as illustrated in FIG. 3A to FIG. 3C, is formed. After forming TFT substrate 101, 15 regions 531 to 545 are cut from the mother glass 5, and 15 sheets of TFT substrate 101 are obtained.

Also in the case of the 15 panels per mother glass production, when forming the first insulating layer PAS1 in 15 regions 531 to 545 of the mother glass 5, for example, the insulator layer is usually formed in whole area of the mother glass 5. Therefore, the thickness distribution of the insulator layer formed in whole area of the mother glass 5 is expressed, for example, by concentric circles centering on the center P of the mother glass 5, as illustrated with the two-dot chain lines in FIG. 6D. The thickness distribution has such a distribution that the film is thickest at the center P and its neighborhood and becomes gradually thinner as apart from the center P.

The relationship between the thickness distribution of the insulator layer (the first insulating layer PAS1) on one sheet of mother glass 5 illustrated in FIG. 6A to FIG. 6D and the thickness distribution of the insulator layer in each region cut from the mother glass 5, that is, in every region where one sheet of the TFT substrate 101 is formed can be seen to be classified into the following four patterns.

The first pattern is a pattern in which the thickness distribution of the insulator layer (the first insulating layer PAS1) has a shape as shown in the regions 501, 502 illustrated in FIG. 6A, and in the regions 537, 539 illustrated in FIG. 6D. The feature of the first pattern is now explained, with reference to FIG. 7.

Figure 7:
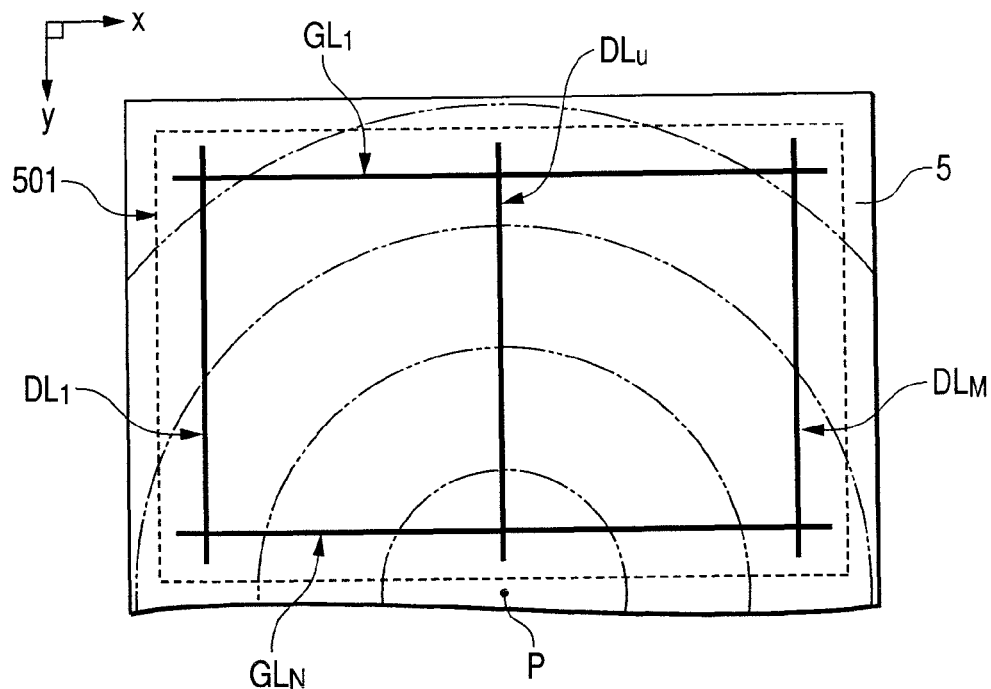
FIG. 7 is a schematic plan view for explaining an example of the updating method of the layout data of the pixel electrode and the counter electrode in the first pattern of the thickness distribution of the first insulating layer.

FIG. 7 is a schematic plan view for explaining an example of the updating method of the layout data of the pixel electrode and the counter electrode in the first pattern of the thickness distribution of the first insulating layer.

In explaining the first pattern of the thickness distribution of the first insulating layer, one region 501 of the mother glass 5 in the case of the 2 panels per mother glass production is referred to as an example, as illustrated in FIG. 7. In FIG. 7, $GL_1$ and $GL_N$ illustrate two scanning signal lines arranged in the outermost part of the display area, and plural scanning signal lines (not shown) are arranged between the two scanning signal lines $GL_1$, $GL_N$. In FIG. 7, $DL_1$ and $DL_M$ illustrate two picture signal lines arranged in the outermost part of the display area, and plural picture signal lines (not shown) are arranged between the two picture signal lines $DL_1$, $DL_M$, including a picture signal line $DL_u$ arranged almost in the middle of the two picture signal lines $DL_1$, $DL_M$.

At this time, the thickness distribution of the first insulating layer PAS1 formed in the region 501 of the mother glass 5 has a shape as illustrated with the two-dot chain line in FIG. 7, for example. That is, the film thickness of the first insulating layer PAS1, viewed in the projection direction (the x direction) of the scanning signal line, becomes monotonically thicker from a point which intersects the picture signal line $DL_1$ toward a point which intersects the picture signal line $DL_u$, attains the thickest value at the neighborhood of a point which intersects the picture signal line $DL_u$, and becomes thinner monotonically from a point which intersects the picture signal line $DL_u$ toward a point which intersects the picture signal line $DL_M$. Therefore, in the TFT substrate 101 formed in the region 501 of the mother glass 5, the layout data of the pixel electrode PX and the counter electrode CT for plural pixels arranged along the scanning signal line $GL_N$, for example, is updated so that the gap between the pixel electrode PX and the counter electrode CT in a pixel located near the picture signal line $DL_u$ should become narrowest, and that the gap between the pixel electrode PX and the counter electrode CT in a pixel located farther away from the picture signal line $DL_u$ should become wider.

At this time, the film thickness of the first insulating layer PAS1, viewed in the projection direction (the y direction) of the picture signal line, becomes thicker monotonically from a point which intersects scanning signal line $GL_1$ toward a point which intersects the scanning signal line $GL_N$. Therefore, in the TFT substrate 101 formed in the region 501 of the mother glass 5, the layout data of the pixel electrode PX and the counter electrode CT for plural pixels arranged along the picture signal line $DL_u$, for example, is updated so that the gap between the pixel electrode PX and the counter electrode CT in a pixel possessing TFT of which the gate is coupled to the scanning signal line $GL_N$ should become narrowest, and that the gap between the pixel electrode PX and the counter electrode CT in a pixel located farther away from the scanning signal line $GL_N$ should become wider.

In this way, in the liquid crystal display panel 1 using the TFT substrate 101 which is obtained by cutting out the region 501 of the mother glass 5, occurrence of the brightness unevenness arising from the difference in the write current value of each TFT can be prevented.

In FIG. 7, one region 501 in the mother glass 5 in the case of the 2 panels per mother glass production is referred to as an example of the first pattern. The layout data for the other region 502 should be updated naturally based on the same way of thinking as the case of the region 501. Furthermore, the layout data for the regions 537, 539 in the case of the 15 panels per mother glass production illustrated in FIG. 6D should be updated naturally based on the same way of thinking as the case of the region 501.

Next, the second pattern is explained. The second pattern is a pattern in which the thickness distribution of the insulator layer (the first insulating layer PAS1) has a shape as shown in the regions 522, 525 illustrated in FIG. 6C, and in the regions 532, 535, 541, 544 illustrated in FIG. 6D. The feature of the second pattern is explained with reference to FIG. 8.

Figure 8:
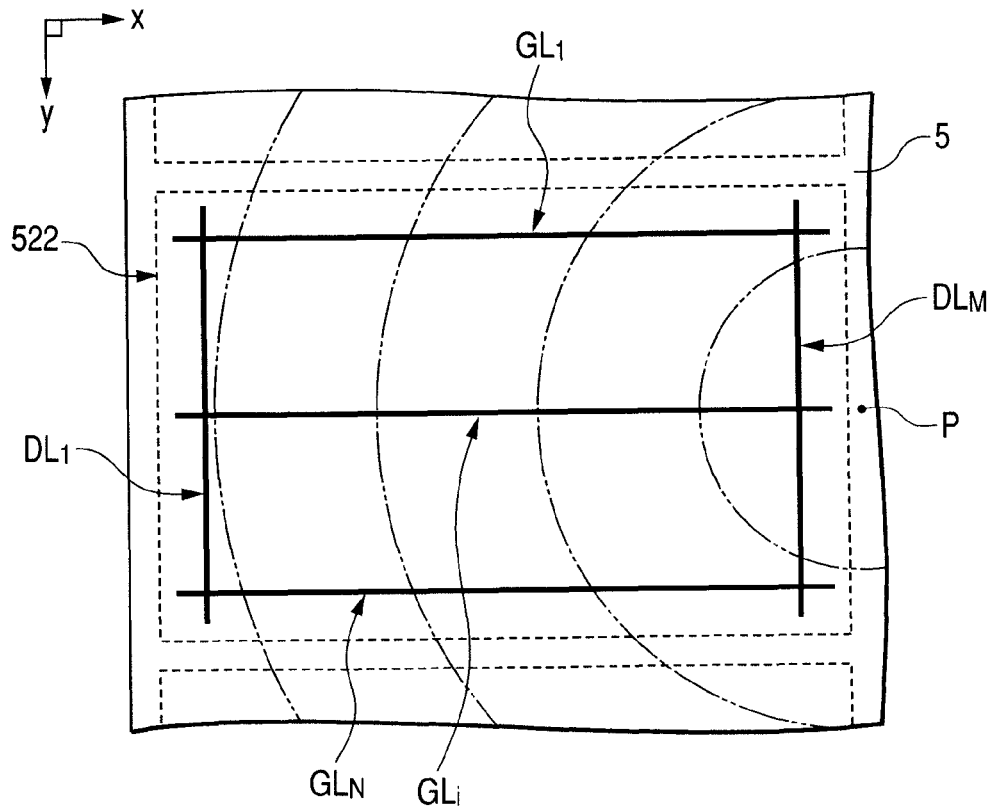
FIG. 8 is a schematic plan view for explaining an example of the updating method of the layout data of the pixel electrode and the counter electrode in the second pattern of the thickness distribution of the first insulating layer.

FIG. 8 is a schematic plan view for explaining an example of the updating method of the layout data of the pixel electrode and the counter electrode in the second pattern of the thickness distribution of the first insulating layer.

In explaining the second pattern of the thickness distribution of the first insulating layer, one region 522 of the mother glass 5 in the case of the 6 panels per mother glass production is referred to as an example, as illustrated in FIG. 8. In FIG. 8, $GL_1$ and $GL_N$ illustrate two scanning signal lines arranged in the outermost part of the display area, and plural scanning signal lines (not shown) are arranged between the two scanning signal lines $GL_1$, $GL_N$, including a scanning signal line $GL_i$ arranged almost in the middle of the two scanning signal lines $GL_1$, $GL_N$. In FIG. 8, $DL_1$ and $DL_M$ illustrate two picture signal lines arranged in the outermost part of the display area, and plural picture signal lines (not shown) are arranged between the two picture signal lines $DL_1$, $DL_M$.

At this time, the thickness distribution of the first insulating layer PAS1 formed in the region 522 of the mother glass 5 has a shape as illustrated with the two-dot chain line in FIG. 8, for example. That is, the film thickness of the first insulating layer PAS1, viewed in the projection direction (the x direction) of the scanning signal line, becomes thicker monotonically from a point which intersects the picture signal line $DL_1$ toward a point which intersects the picture signal line $DL_M$. Therefore, in the TFT substrate 101 formed in the region 522 of the mother glass 5, the layout data of the pixel electrode PX and the counter electrode CT for plural pixels arranged, for example, along the scanning signal line $GL_i$ is updated so that the gap between the pixel electrode PX and the counter electrode CT in a pixel possessing TFT of which the drain is coupled to the picture signal line $DL_M$ should become narrowest, and that the gap between the pixel electrode PX and the counter electrode CT in a pixel located farther away from the picture signal line $DL_M$ should become wider.

At this time, the film thickness of the first insulating layer PAS1, viewed in the projection direction (the y direction) of the picture signal line, becomes monotonically thicker from a point which intersects the scanning signal line $GL_1$ toward a point which intersects the scanning signal line $GL_i$, attains the thickest value at the neighborhood of a point which intersects the scanning signal line $GL_i$, and becomes thinner monotonically from a point which intersects the scanning signal line $GL_i$ toward a point which intersects the scanning signal line $GL_N$. Therefore, in the TFT substrate 101 formed in the region 522 of the mother glass 5, the layout data of the pixel electrode PX and the counter electrode CT for plural pixels arranged, for example, along the picture signal line $DL_M$ is updated so that the gap between the pixel electrode PX and the counter electrode CT in a pixel located near the scanning signal line $GL_i$ should become narrowest, and that the gap between the pixel electrode PX and the counter electrode CT in a pixel located farther away from the scanning signal line $GL_i$ should become wider.

In this way, in the liquid crystal display panel 1 using the TFT substrate 101 which is obtained by cutting out the region 522 of the mother glass 5, occurrence of the brightness unevenness arising from the difference in the write current value of each TFT can be prevented.

In FIG. 8, one region 522 in the mother glass 5 in the case of the 6 panels per mother glass production is referred to as an example of the second pattern. The layout data for the other region 525 should be updated naturally based on the same way of thinking as the case of the region 522. Furthermore, the layout data for the regions 532, 535, 541, 544 in the case of the 15 panels per mother glass production illustrated in FIG. 6D should be updated naturally based on the same way of thinking as the case of the region 522.

Next, the third pattern is explained. The third pattern is a pattern in which the thickness distribution of the insulator layer (the first insulating layer PAS1) has a shape as shown in the regions 511, 512, 513, 514 illustrated in FIG. 6B, in the regions 521, 523, 524, 526 illustrated in FIG. 6C, and in the regions 531, 533, 534, 536, 540, 542, 543, 545 illustrated in FIG. 6D. The feature of the third pattern is explained with reference to FIG. 9.

Figure 9:
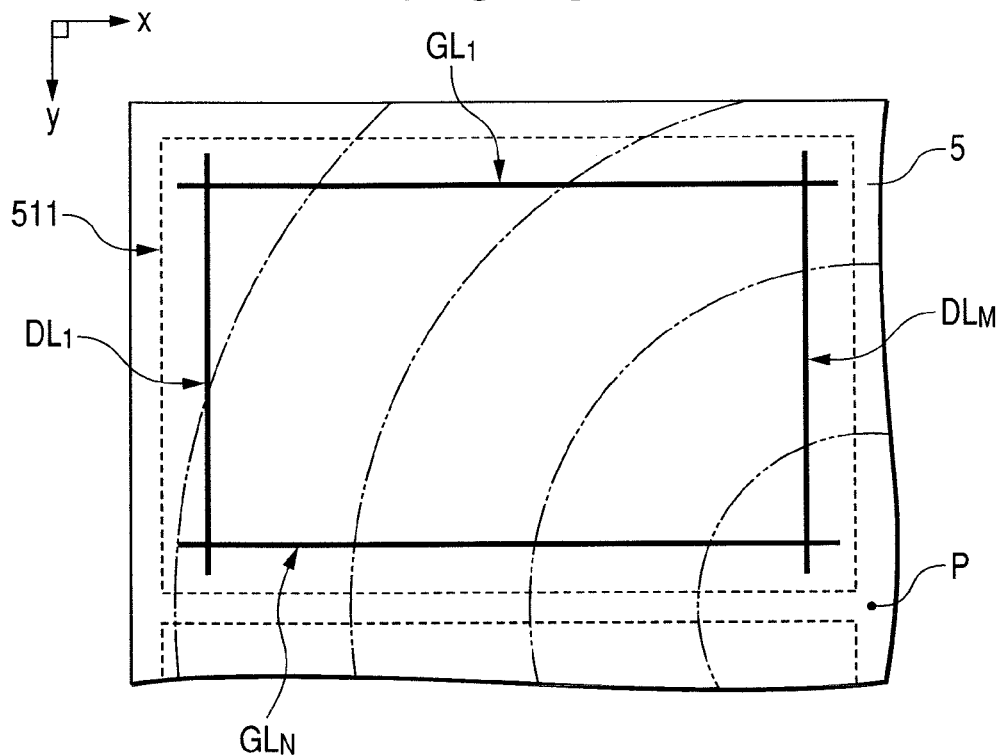
FIG. 9 is a schematic plan view for explaining an example of the updating method of the layout data of the pixel electrode and the counter electrode in the third pattern of the thickness distribution of the first insulating layer.

FIG. 9 is a schematic plan view for explaining an example of the updating method of the layout data of the pixel electrode and the counter electrode in the third pattern of the thickness distribution of the first insulating layer.

In explaining the third pattern of the thickness distribution of the insulator layer, one region 511 of the mother glass 5 in the case of the 4 panels per mother glass production is referred to as an example, as illustrated in FIG. 9. In FIG. 9, $GL_1$ and $GL_N$ illustrate two scanning signal lines arranged in the outermost part of the display area, and plural scanning signal lines (not shown) are arranged between the two scanning signal lines $GL_1$, $GL_N$. In FIG. 9, $DL_1$ and $DL_M$ illustrate two picture signal lines arranged in the outermost part of the display area, and plural picture signal lines (not shown) are arranged between the two picture signal lines $DL_1$, $DL_M$.

At this time, the thickness distribution of the first insulating layer PAS1 formed in the region 511 of the mother glass 5 has a shape as illustrated with the two-dot chain line in FIG. 9, for example. That is, the film thickness of the first insulating layer PAS1, viewed in the projection direction (the x direction) of the scanning signal line, becomes thicker monotonically from a point which intersects the picture signal line $DL_1$ toward a point which intersects the picture signal line $DL_M$. Therefore, in the TFT substrate 101 formed in the region 511 of the mother glass 5, the layout data of the pixel electrode PX and the counter electrode CT for plural pixels arranged, for example, along the scanning signal line $GL_N$ is updated so that the gap between the pixel electrode PX and the counter electrode CT in a pixel possessing TFT of which the drain is coupled to the picture signal line $DL_M$ should become narrowest, and that the gap between the pixel electrode PX and the counter electrode CT in a pixel located farther away from the picture signal line $DL_M$ should become wider.

At this time, the film thickness of the first insulating layer PAS1, viewed in the projection direction (the y direction) of the picture signal line, becomes thicker monotonically from a point which intersects the scanning signal line $GL_1$ toward a point which intersects the scanning signal line $GL_N$. Therefore, in the TFT substrate 101 formed in the region 511 of the mother glass 5, the layout data of the pixel electrode PX and the counter electrode CT for plural pixels arranged, for example, along the picture signal line $DL_M$ is updated so that the gap between the pixel electrode PX and the counter electrode CT in a pixel possessing TFT of which the gate is coupled to the scanning signal line $GL_N$ should become narrowest and that the gap between the pixel electrode PX and the counter electrode CT in a pixel farther away from the scanning signal line $GL_N$ should become wider.

In this way, in the liquid crystal display panel 1 using the TFT substrate 101 which is obtained by cutting out the region 511 of the mother glass 5, occurrence of the brightness unevenness arising from the difference in the write current value of each TFT can be prevented.

In FIG. 9, one region 511 in the mother glass 5 in the case of the 4 panels per mother glass production is referred to as an example of the third pattern. The layout data for the other three regions 512 to 514 should be updated naturally based on the same way of thinking as the case of the region 511. Furthermore, the layout data for the regions 521, 523, 524, 526 in the case of the 6 panels per mother glass production illustrated in FIG. 6C, and for the regions 532, 535, 541, 544 in the case of the 15 panels per mother glass production illustrated in FIG. 6D should be updated, naturally based on the same way of thinking as the case of the region 511.

Finally, the fourth pattern is explained. The fourth pattern is a pattern in which the thickness distribution of the insulator layer (the first insulating layer PAS1) has a shape as shown in the region 538 illustrated in FIG. 6D. The feature of the fourth pattern is explained with reference to FIG. 10.

Figure 10:
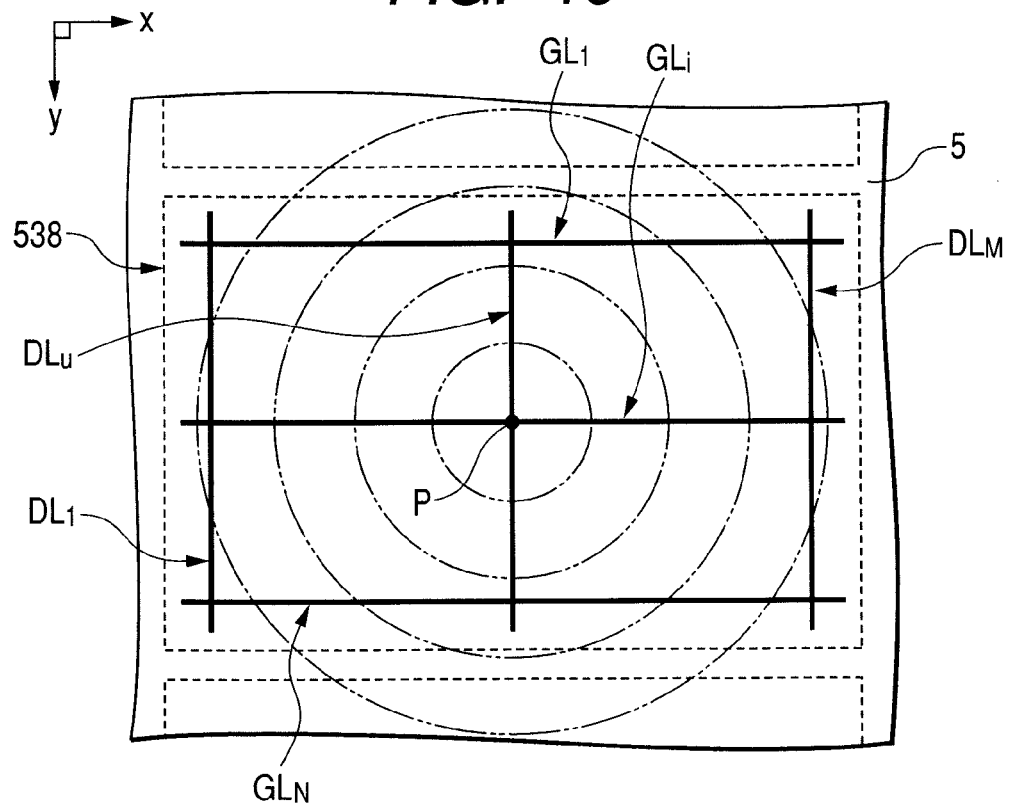
FIG. 10 is a schematic plan view for explaining an example of the updating method of the layout data of the pixel electrode and the counter electrode in the fourth pattern of the thickness distribution of the first insulating layer.

FIG. 10 is a schematic plan view for explaining an example of the updating method of the layout data of the pixel electrode and the counter electrode in the fourth pattern of the thickness distribution of the first insulating layer.

In explaining the fourth pattern of the thickness distribution of the first insulating layer PAS1, one region 538 of the mother glass 5 in the case of the 15 panels per mother glass production is referred to as an example, as illustrated in FIG. 10. In FIG. 10, $GL_1$ and $GL_N$ illustrate two scanning signal lines arranged in the outermost part of the display area, and plural scanning signal lines (not shown) are arranged between the two scanning signal lines $GL_1$, $GL_N$, including a scanning signal line $GL_i$ arranged almost in the middle of the two scanning signal lines $GL_i$, $GL_N$. In FIG. 10, $DL_1$ and $DL_M$ illustrate two picture signal lines arranged in the outermost part of the display area, and plural picture signal lines (not shown) are arranged between the two picture signal lines $DL_1$, $DL_M$, including a picture signal line $DL_u$ arranged almost in the middle of the two picture signal lines $DL_1$, $DL_M$.

At this time, the thickness distribution of the first insulating layer PAS1 formed in the region 538 of the mother glass 5 has a shape as illustrated with the two-dot chain line in FIG. 10, for example. That is, the film thickness of the first insulating layer PAS1, viewed in the projection direction (the x direction) of the scanning signal line, becomes thicker monotonically from a point which intersects the picture signal line $DL_1$ toward a point which intersects the picture signal line $DL_u$, attains the thickest value at the neighborhood of a point which intersects the picture signal line $DL_u$, and becomes thinner monotonically from a point which intersects the picture signal line $DL_u$ toward a point which intersects the picture signal line $DL_M$. Therefore, in the TFT substrate 101 formed in the region 538 of the mother glass 5, the layout data of the pixel electrode PX and the counter electrode CT for plural pixels arranged, for example, along the scanning signal line $GL_1$ is updated so that the gap between the pixel electrode PX and the counter electrode CT in a pixel near the picture signal line $DL_u$ should becomes narrowest, and that the gap between the pixel electrode PX and the counter electrode CT in a pixel farther away from the picture signal line $DL_u$ should become wider.

At this time, the film thickness of the first insulating layer PAS1, viewed in the projection direction (the y direction) of the picture signal line, becomes thicker monotonically from a point which intersects the scanning signal line $GL_1$ toward a point which intersects the scanning signal line $GL_i$, attains the thickest value at the neighborhood of a point which intersects the scanning signal line $GL_1$ and becomes thinner monotonically from a point which intersects the scanning signal line $GL_i$ toward a point which intersects the scanning signal line $GL_N$. Therefore, in the TFT substrate 101 formed in the region 538 of the mother glass 5, the layout data of the pixel electrode PX and the counter electrode CT for plural pixels arranged, for example, along the picture signal line $DL_u$ is updated so that the gap between the pixel electrode PX and the counter electrode CT in a pixel near the scanning signal line $GL_i$ should become narrowest, and that the gap between the pixel electrode PX and the counter electrode CT in a pixel farther away from the scanning signal line $GL_i$ should become wider.

In this way, in the liquid crystal display panel 1 using the TFT substrate 101 which is obtained by cutting out the region 538 of the mother glass 5, occurrence of the brightness unevenness arising from the difference in the write current value of each TFT can be prevented.

In FIG. 10, one region 538 in the mother glass 5 in the case of the 15 panels per mother glass production is referred to as an example of the fourth pattern. Not limiting to the 15 panels per mother glass production, but layout data for the region of the center in the case of the 9 panels per mother glass production (that is, 3×3 sheets) should be updated, naturally based on the same way of thinking as the case of the region 538, for example.

As explained in the above, according to the liquid crystal display panel 1 using the TFT substrate 101 of Embodiment 1, brightness unevenness arising from the difference in the film thickness of the gate insulating film in each TFT can be reduced. Therefore, the display quality of the liquid crystal display device can be enhanced.

Since the TFT substrate 101 of Embodiment 1 can be manufactured in the procedure as illustrated in FIG. 5, for example, the TFT substrate 101 of which the brightness unevenness arising from the difference in the write current value of each TFT is reduced can be manufactured easily.

Moreover, the liquid crystal display panel 1 using the TFT substrate 101 of Embodiment 1 can reduce the brightness unevenness arising from the difference in the write current value of each TFT, without converting the scanning signal into a three-level signal as described in JP-A 2004-004876. Therefore, the liquid crystal display device with a narrow picture frame can be easily manufactured.

Embodiment 2

Figure 11A:
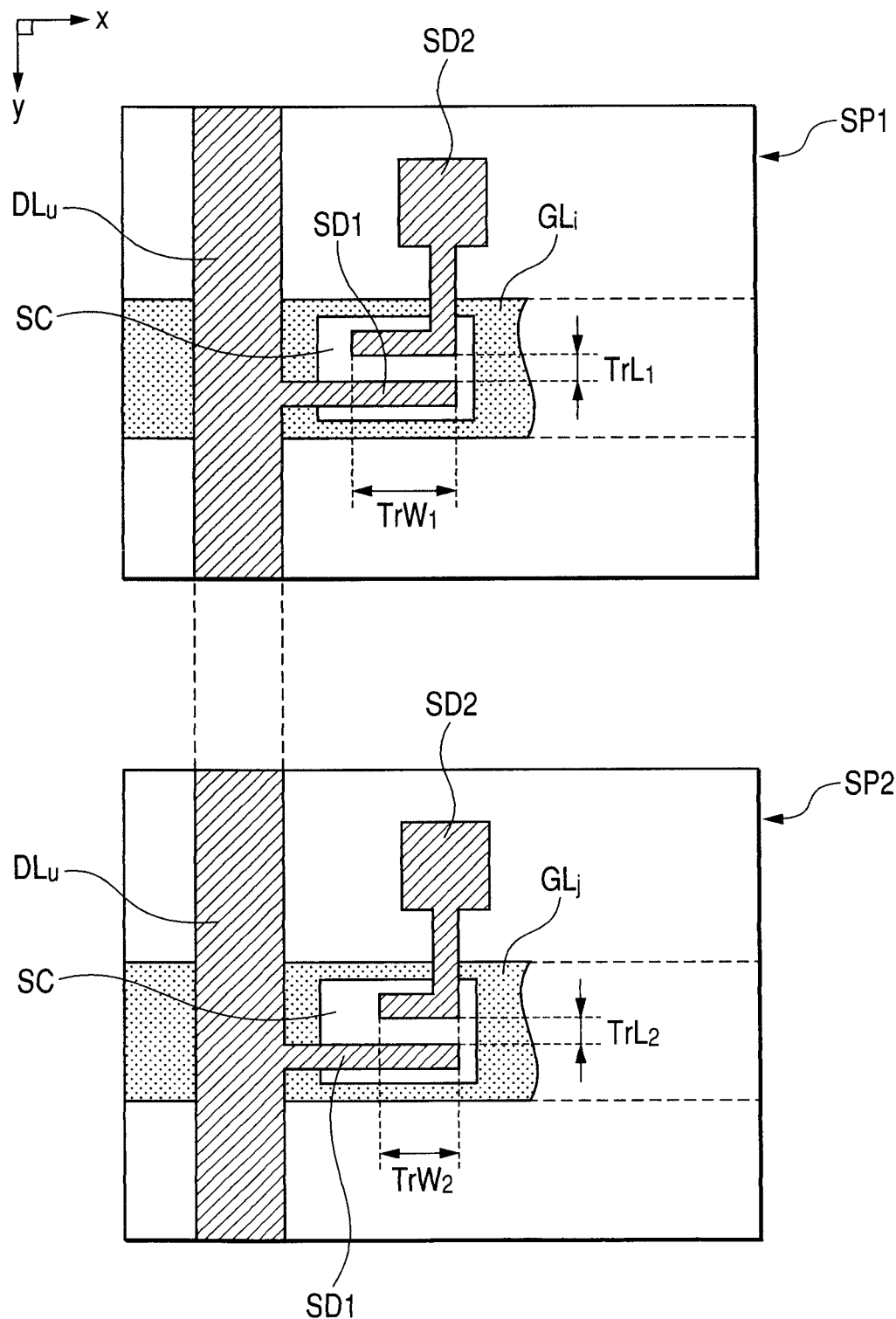
FIG. 11A is a schematic plan view illustrating an example of the plane shape of TFT of two pixels SP1 and SP2 in the TFT substrate according to Embodiment 2.

FIG. 11A and FIG. 11B are schematic diagrams illustrating an example of the outline structure of a TFT substrate according to Embodiment 2 of the present invention.

FIG. 11A is a schematic plan view illustrating an example of the plane shape of TFT of two pixels SP1 and SP2 in the TFT substrate according to Embodiment 2. FIG. 11B is a schematic plan view illustrating an example of the relationship of pixel electrodes and counter electrodes for two pixels SP1 and SP2 illustrated in FIG. 11A.

FIG. 11A is the plan view illustrating only the structure of TFT necessary for explaining the feature of the TFT substrate according to Embodiment 2, and the holding capacity line SL is omitted from the plan view.

The fundamental structure of TFT substrate 101 in Embodiment 2 is the same as TFT substrate 101 in Embodiment 1, wherein the structure of one pixel is as illustrated in FIG. 3A to FIG. 3C.

Embodiment 1 has exemplified the case where the plane shape of TFT of the first pixel SP1 and the plane shape of TFT of the second pixel SP2, which are illustrated in FIG. 4A, are almost the same, and the film thickness of the gate insulating film of each TFT differs. However, when manufacturing the TFT substrate 101, for example, a channel width $TrW_2$ in TFT of the second pixel SP2 may become smaller than a channel width $TrW_1$ in TFT of the first pixel SP1, as illustrated in FIG. 11A. At this time, the value $(TrW_2/TrL_2)$ obtained by dividing the channel width $TrW_2$ by the channel length $TrL_2$ in TFT of the second pixel SP2 becomes smaller than the value $(TrW_1/TrL_1)$ obtained by dividing the channel width $TrW_1$ by the channel length $TrL_1$ in TFT of the first pixel SP1. Therefore, the write current value of TFT of the second pixel SP2 becomes smaller than the write current value of TFT of the first pixel SP1.

Even in the case where such a difference arises in the write current value of TFT of the first pixel SP1 and the write current value of TFT of the second pixel SP2, due to the difference of at least one of the channel width and channel length of TFT, it is possible to make the brightness of the first pixel SP1 and the brightness of the second pixel SP2 almost the same, by changing the gap between the pixel electrode PX and the counter electrode CT, as in the case of Embodiment 1.

That is, when the relationship between TFT of the first pixel SP1 and TFT of the second pixel SP2 is as illustrated in FIG. 11A, and assuming that for example, as illustrated in FIG. 11B, the gap between the pixel electrode PX and the counter electrode CT in the first pixel SP1 is in the order of $Lg1_1, Lg2_1, Lg3_1$, and $Lg4_1$ from the side of the picture signal line $DL_n$, and assuming that the gap between the pixel electrode PX and the counter electrode CT in the second pixel SP2 is in the order of $Lg1_2, Lg2_2, Lg3_2$, and $Lg4_2$ from the side of the picture signal line $DL_n$, then the pixel electrode PX and the counter electrode CT of the pixels SP1 and SP2 are formed so that the following relationship is satisfied among the gaps: $Lg1_1>Lg1_2$, $Lg2_1>Lg2_2$, $Lg3_1>Lg3_2$, and $Lg4_1>Lg4_2$.

Such relationship is made to be satisfied not only between, for example, the first pixel SP1 and the second pixel SP2s, but also between, for example, the third pixel SP3 and the fourth pixel SP4 illustrated in FIG. 4A. Such relationship is also made to be satisfied between the first pixel SP1 and the third pixel SP3, between the second pixel SP2 and the fourth pixel SP4, and between others.

Furthermore, in the TFT substrate 101 according to Embodiment 2, when two arbitrary pixels are chosen not only from the four pixels (SP1, SP2, SP3, SP4) illustrated in FIG. 4A, but from all the pixels in the display area DA, regarding the size ratio (TrW/TrL) of TFT of the two pixels concerned, it is made for the gap between the pixel electrode PX and the counter electrode CT in a pixel of which the size ratio of TFT is greater to become wider than the gap between the pixel electrode PX and the counter electrode CT in a pixel of which the size ratio of TFT is smaller.

Figure 12:
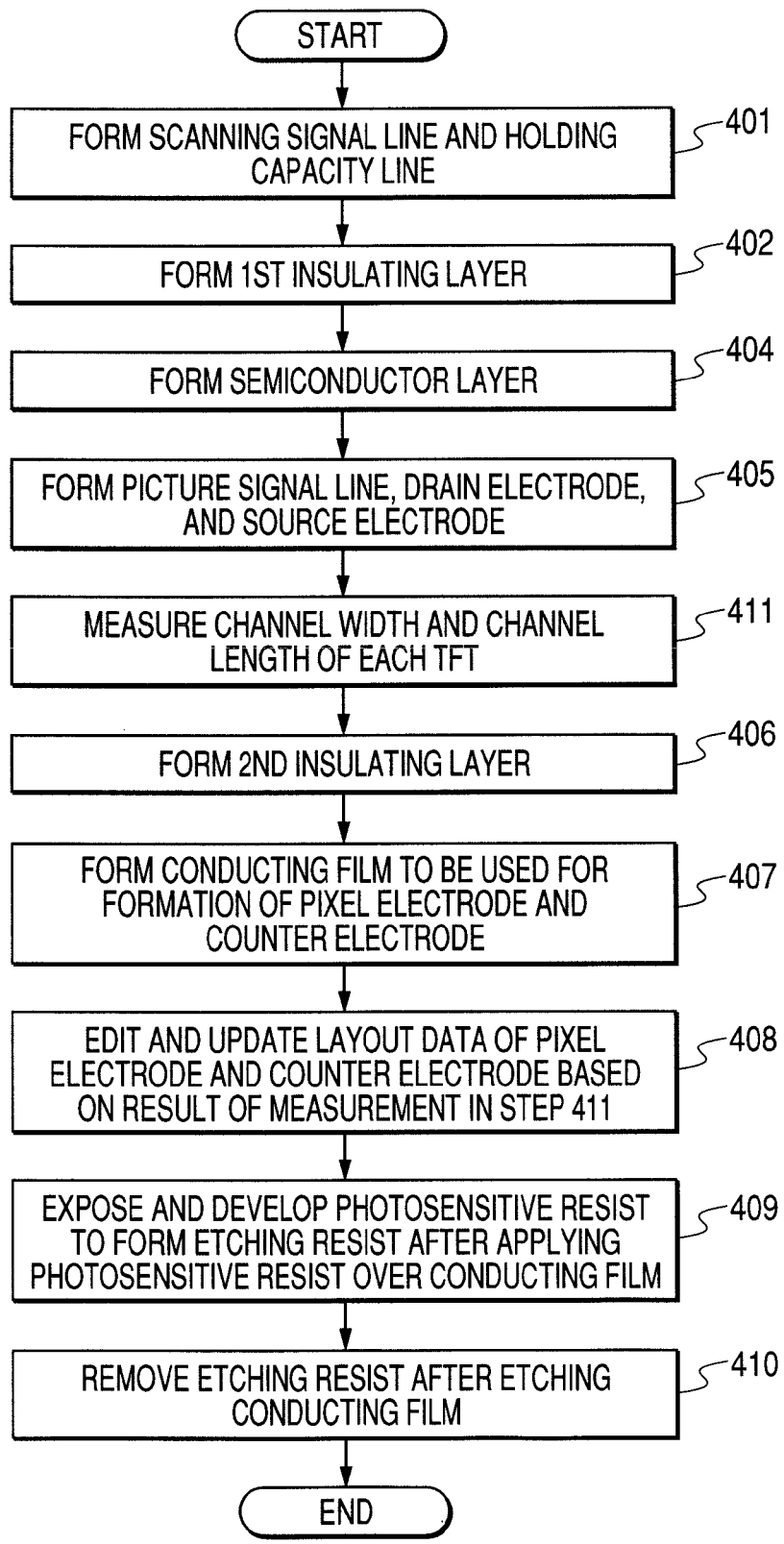
FIG. 12 is a schematic flow chart for explaining an example of the manufacturing method of the TFT substrate according to Embodiment 2.

FIG. 12 is a schematic flow chart for explaining an example of the manufacturing method of the TFT substrate according to Embodiment 2.

When manufacturing the TFT substrate 101 according to Embodiment 2, as illustrated in FIG. 12, a scanning signal line GL and a holding capacity line SL are first formed over the surface of an insulating substrate SUB, such as a glass substrate (Step 401). Next, a first insulating layer PAS1 which possesses the function as a gate insulating film of TFT is formed (Step 402). Next, a semiconductor layer SC is formed (Step 404). Next, a picture signal line DL, a drain electrode SD1 and a source electrode SD2 are formed (Step 405). Step 401, Step 402, Step 404, and Step 405 may follow respectively the same procedure as the process of forming the scanning signal line GL and the holding capacity line SL, the process of forming the first insulating layer PAS1, the process of forming the semiconductor layer SC, and the process of forming the picture signal line DL and the drain electrode SD1 and the source electrode SD2, in the conventional manufacturing method of the TFT substrate. Therefore, the detailed explanation thereof is omitted.

Next, the channel width TrW and the channel length TrL of each TFT are measured (Step 411). Step 411 should just perform measurement using a level difference measurement instrument, a laser spectrometer, or a picture taken with a camera, for example. Therefore, the detailed explanation thereof is omitted. When measuring the channel width TrW and channel length TrL of TFT, for example, the measurement may be performed for all the TFTs, or alternatively, after dividing the whole region into some sub-regions, the measurement may be performed for the channel width TrW and channel length TrL of TFT which represents each sub-region, and the channel width TrW and channel length TrL of TFT which represents one sub-region may be regarded as equal to the channel width TrW and channel length TrL of several other TFTs in the sub-region.

Next, a second insulating layer PAS2 is formed (Step 406). Next, a conducting film (for example, ITO film) used for formation of a pixel electrode PX and a counter electrode CT is formed (Step 407). Step 406 and Step 407 may follow respectively the same procedure as the process of forming the second insulating layer PAS2 and the process of forming the conducting film (ITO film), in the conventional manufacturing method of the TFT substrate. Therefore, the detailed explanation thereof is omitted.

Next, based on the measurement result of Step 411, the layout data (plane size) of the pixel electrode PX and the counter electrode CT are edited and updated (Step 408). In Step 408, for example as illustrated in FIG. 11A and FIG. 11B, the plane size of the pixel electrode PX and the plane size of counter electrode CT are updated, so that the gap between the pixel electrode PX and the counter electrode CT of a pixel with a greater size ratio (TrW/TrL) of TFT becomes wider, and that the gap between the pixel electrode PX and the counter electrode CT of a pixel with a smaller size ratio of TFT becomes narrower. Although Step 408 is performed after Step 407 in the example illustrated in FIG. 12, the stage of Step 408 is not limited to the case. Step 408 may be performed in any stage, of course, as long as it is performed after Step 411 and before the next Step 409.

Next, after applying a photosensitive resist over the conducting film formed at Step 407, the photosensitive resist concerned is exposed and developed and an etching resist is formed (Step 409). When exposing the photosensitive resist at Step 409, for example, the direct imaging machine which has been explained in Embodiment 1 is used.

Next, after etching the conducting film using the etching resist formed at Step 409 as a mask, the etching resist is exfoliated (removed) to form the pixel electrode PX and the counter electrode CT (Step 410).

The TFT substrate 101 of Embodiment 2 is obtained by the above procedure.

In this way, when a difference arises in the size ratio (TrW/TrL) of each TFT in the manufacturing process of the TFT substrate 101, the TFT substrate 101 according to Embodiment 2 can easily reduce the brightness unevenness of the liquid crystal display device arising from the difference in the size ratio of each TFT, by changing the gap between the pixel electrode PX and the counter electrode CT of each pixel in accordance with the difference.

In the above-described explanation of the manufacturing method following FIG. 12, the use of the direct imaging machine is exemplified for exposing the photosensitive resist at Step 409. However, when exposing the photosensitive resist at Step 409, it is also possible to perform the exposure, for example, by using an exposure mask in which the exposure pattern is formed with a light-shielding layer, such as chromium (Cr), over the surface of a transparent substrate, such as a glass substrate. In that case, what is necessary is to prepare an exposure mask by using the layout data of the pixel electrode PX and the counter electrode CT and to perform exposure using the exposure mask concerned, wherein the layout data has been updated based on the size ratio of each TFT in a TFT substrate 101 which is manufactured by way of trial, for example.

In the procedure illustrated in FIG. 12, the layout data of the pixel electrode PX and the counter electrode CT is updated only based on the size ratio of each TFT. However, when manufacturing the TFT substrate 101, as explained in Embodiment 1, change may arise in the film thickness of the first insulating layer PAS1 which functions as a gate insulating film of each TFT. Therefore, if the TFT substrate 101 is manufactured, by taking into consideration the difference in the film thickness of the gate insulating film (the first insulating layer PAS1) in addition to the difference in the size ratio of each TFT, the brightness unevenness of the liquid crystal display device arising from the difference in the size ratio of each TFT and the difference in the film thickness of the gate insulating film can be reduced easily.

Figure 13:
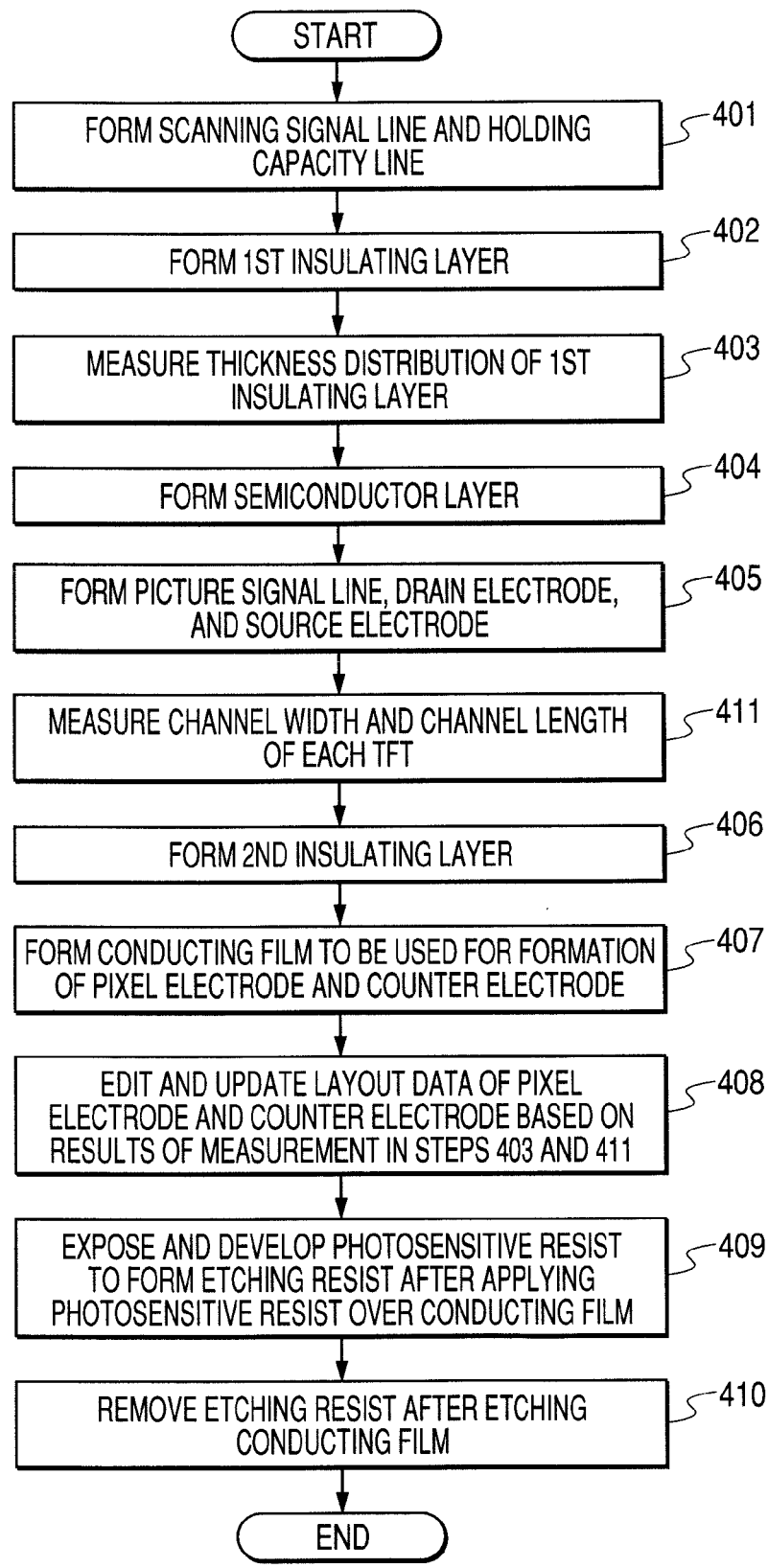
FIG. 13 is a schematic flow chart for explaining the application of the manufacturing method of the TFT substrate according to Embodiment 2.

FIG. 13 is a schematic flow chart for explaining the application of the manufacturing method of the TFT substrate according to Embodiment 2.

In the more desirable manufacturing method of the TFT substrate 101 according to Embodiment 2, for example, a scanning signal line GL and a holding capacity line SL over the surface of the insulating substrate SUB, such as a glass substrate, are formed first, as illustrated in FIG. 13 (Step 401). Next, a first insulating layer PAS1 which possesses the function as a gate insulating film of TFT is formed (Step 402). Step 401 and Step 402 may follow respectively the same procedure as the process of forming the scanning signal line GL and the holding capacity line SL and the process of forming the first insulating layer PAS1, in the conventional manufacturing method of the TFT substrate. Therefore, the detailed explanation thereof is omitted.

Next, the thickness distribution of the first insulating layer PAS1 is measured (Step 403). At Step 403, the film thickness of the first insulating layer PAS1 in the position where TFT of each pixel is formed is measured using an ellipsometer, for example. When measuring the film thickness, for example, the film thickness of all the positions where TFTs are formed may be measured, or alternatively, dividing the whole region into some sub-regions, the film thickness in a representative point of each sub-region may be measured, and it may be regarded that the film thickness in several positions where TFTs are formed in each sub-region is equal to the film thickness in the representative point of the sub-region.

Next, a semiconductor layer SC is formed (Step 404). Next, a picture signal line DL, a drain electrode SD1, and a source electrode SD2 are formed (Step 405). Step 404 and Step 405 may follow respectively the same procedure as the process of forming the semiconductor layer SC and the process of forming the picture signal line DL, the drain electrode SD1, and the source electrode SD2, in the conventional manufacturing method of the TFT substrate. Therefore, the detailed explanation thereof is omitted.

Next, the channel width TrW and the channel length TrL of each TFT are measured (Step 411). Step 411 should just perform measurement using a level difference measurement instrument, a laser spectrometer, or a picture taken with a camera, for example. Therefore, the detailed explanation thereof is omitted. When measuring the channel width TrW and channel length TrL of TFT, for example, the measurement may be performed for all the TFTs, or alternatively, after dividing the whole region into some sub-regions and the measurement may be performed for the channel width TrW and channel length TrL of TFT which represents each sub-region, and the channel width TrW and channel length TrL of TFT which represents one sub-region may be regarded as equal to the channel width TrW and channel length TrL of several other TFTs in the sub-region.

Next, a second insulating layer PAS2 is formed (Step 406). Next, a conducting film (for example, ITO film) used for formation of a pixel electrode PX and a counter electrode CT is formed (Step 407). Step 406 and Step 407 may follow respectively the same procedure as the process of forming the second insulating layer PAS2 and the process of forming the conducting film (ITO film), in the conventional manufacturing method of the TFT substrate. Therefore, the detailed explanation thereof is omitted.

Next, based on the measurement results of Step 403 and Step 411, the layout data (plane size) of the pixel electrode PX and the counter electrode CT is edited and updated (Step 408).

Next, after applying a photosensitive resist over the conducting film formed at Step 407, the photosensitive resist concerned is exposed and developed and an etching resist is formed (Step 409). When exposing the photosensitive resist at Step 409, for example, the direct imaging machine which has been explained in Embodiment 1 is used.

Next, after etching the conducting film using the etching resist formed at Step 409 as a mask, the etching resist is exfoliated (removed) to form the pixel electrode PX and the counter electrode CT (Step 410).

By the above procedure, it is possible to obtain the TFT substrate 101 which can reduce furthermore the brightness unevenness arising from the difference in the size ratio of each TFT and the difference in the film thickness of the gate insulating film.

In manufacturing the TFT substrate 101, when the channel width $TrW_1$ and channel length $TrL_1$ of TFT of the first pixel SP1, and the channel width $TrW_2$ and channel length $TrL_2$ of TFT of the second pixel SP2 satisfy the relationship as illustrated in FIG. 11A, the comparison of the film thickness of the gate insulating film (the first insulating layer PAS1) of each TFT may occasionally unveil the fact that the film thickness of the gate insulating film in TFT of the second pixel SP2 is thicker.

In such a case, the difference of the write current value of TFT of the first pixel SP1 and the write current value of TFT of the second pixel SP2 becomes still greater, due to the factors of the difference in the size ratio (TrW/TrL) of TFT, and the difference of the film thickness of the gate insulating film.

However, if the TFT substrate 101 is manufactured according to the procedure as illustrated in FIG. 13, even when, in comparison between TFT of the first pixel SP1 and TFT of the second pixel SP2, the second pixel SP2 possesses TFT with smaller size ratio and the gate insulating film with thicker film thickness, the difference of the brightness in the first pixel SP1 and in the second pixel SP2 can be reduced easily.

Embodiment 3

Figure 14A:
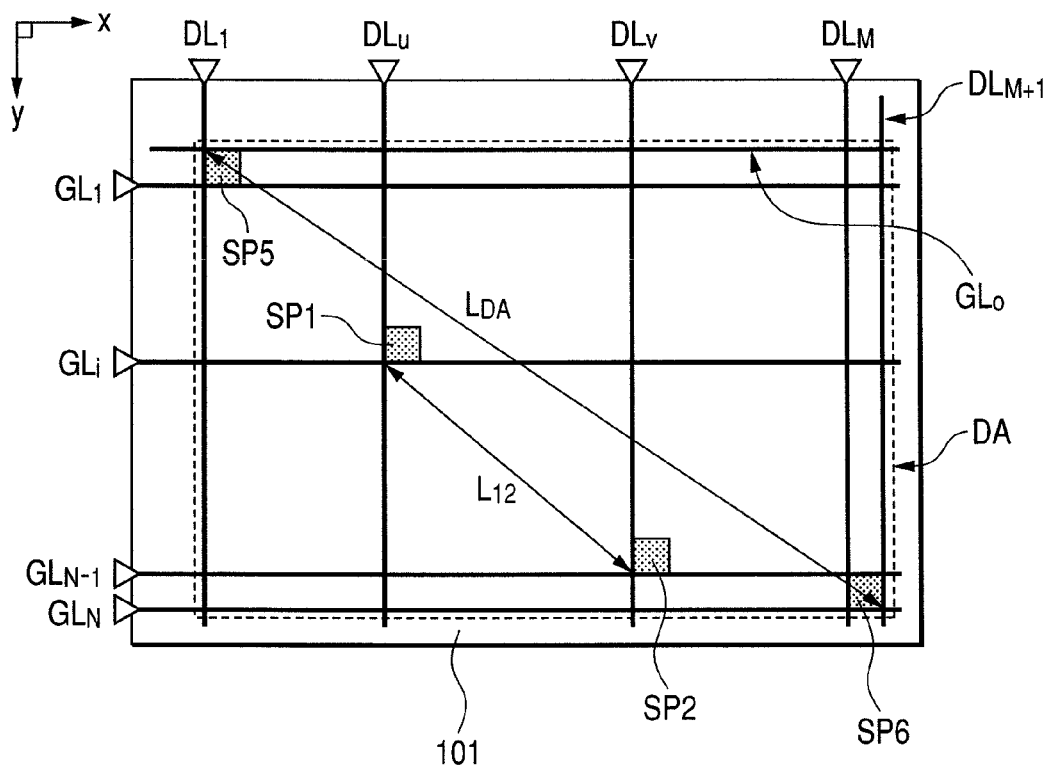
FIG. 14A is a schematic plan view for explaining how to estimate the variation in the etching amount in a sheet of TFT substrate.
Figure 14C:
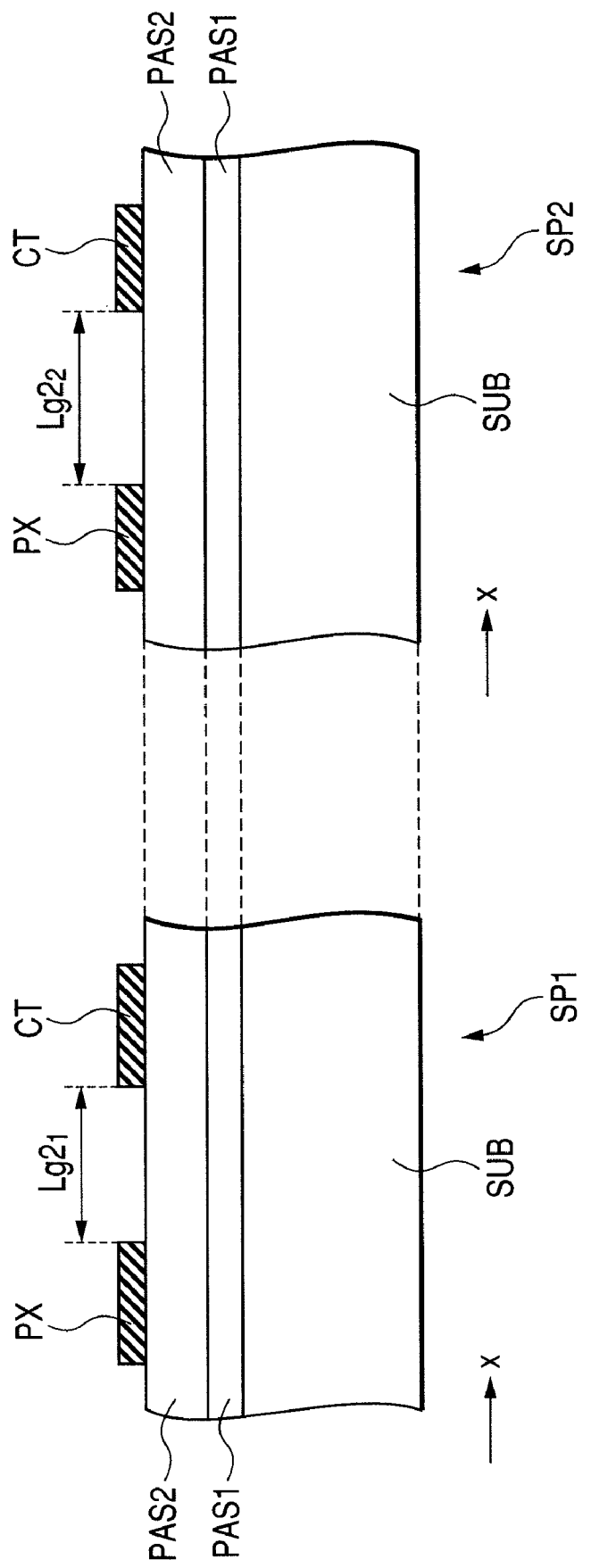
FIG. 14C is a schematic sectional view illustrating an example of the variation in the etching amount in two pixels SP1 and SP2 illustrated in FIG. 14A.

FIG. 14A to FIG. 14C are schematic diagrams for explaining an example of the outline structure of the liquid crystal display panel according to Embodiment 3 of the present invention.

FIG. 14A is a schematic plan view for explaining how to estimate the variation in the etching amount in a sheet of TFT substrate; FIG. 14B is a schematic sectional view illustrating an example of the variation in the etching amount in two pixels SP5 and SP6 located in the diagonal of a display area DA illustrated in FIG. 14A; and FIG. 14C is a schematic sectional view illustrating an example of the variation in the etching amount in two pixels SP1 and SP2 illustrated in FIG. 14A.

When manufacturing the TFT substrate 101 of structure which has been explained in Embodiment 1 and Embodiment 2, the photosensitive resist applied on the conducting film (ITO film) to be used for formation of the pixel electrode PX and the counter electrode CT is exposed, by using, for example, the layout data of the pixel electrode PX and the counter electrode CT, wherein the layout data has been updated, based on the thickness distribution of the first insulating layer PAS1 or the size ratio (TrW/TrL) of each TFT. Therefore, the actually formed gap between the pixel electrode PX and the counter electrode CT may deviate from the size in the updated layout data, for example, due to the variation in the etching amount produced when the conducting film (ITO film) is etched.

In order to investigate how much variation the etching amount yields on one sheet of the TFT substrate 101 when the conducting film (ITO) is etched, the present inventors investigated first the variation in the size of the gap between the pixel electrode PX and the counter electrode CT in two pixels SP5 and SP6 located respectively in the opposing corners of the display area DA, as illustrated in FIG. 14A. At this time, over the surface of an insulating substrate SUB, such as a glass substrate, a first insulating layer PAS1 and a second insulating layer PAS2 both possessing uniform thickness were formed. Over the second insulating layer PAS2, a conducting film (ITO film) possessing uniform thickness was formed and etched using a mask of an etching resist which was formed so that the gap between the pixel electrode PX and the counter electrode CT in all the pixels might become uniform.

As the result of the investigation, it was found that, as illustrated in FIG. 14B, the gap $Lg2_5$ between the pixel electrode PX and the counter electrode CT near the pixel SP5 located in one opposing corner of the display area DA and the gap $Lg2_6$ between the pixel electrode PX and the counter electrode CT near the pixel SP6 located in the other opposing corner hold the relationship that $Lg2_6 > Lg2_5$. In the example which the present inventors investigated, when the diagonal size $L_{DA}$ of the display area DA is 80 cm, the difference in the gap between the pixel electrode PX and the counter electrode CT of two pixels SP5, SP6, $(Lg2_6 - Lg2_5)$, is 2.6 μm.

From the result, it is predicted that, when a TFT substrate 101 possessing the diagonal size $L_{DA}$ of the display area DA of 80 cm is manufactured, the gap between the pixel electrode PX and the counter electrode CT in two arbitrary pixels yields the variation of 2.6 μm at the maximum, due to the variation in the etching amount.

At this time, the gap $Lg2_1$ between the pixel electrode PX and the counter electrode CT in the first pixel SP1 and the gap $Lg2_2$ between the pixel electrode PX and the counter electrode CT in the second pixel SP2, illustrated in FIG. 14A, are in the relationship as illustrated in FIG. 14C for example. At this time, the gap $Lg2_1$ between the pixel electrode PX and the counter electrode CT in the first pixel SP1 satisfies the inequality that $Lg2_2 > Lg2_1 > Lg2_5$, and the gap $Lg2_2$ between the pixel electrode PX and the counter electrode CT in the second pixel SP2 satisfies the inequality that $Lg2_6 > Lg2_2 > Lg2_1$. Therefore, the difference in the gap between the pixel electrode PX and the counter electrode CT between two pixels SP1 and SP2, $(Lg2_6 - Lg2_5)$, is smaller than 2.6 μm.

In this way, when the conducting film (ITO film) is etched and the etching amount in each point on one sheet of the TFT substrate 101 has variation, even if the pixel electrode PX and the counter electrode CT are formed by use of the layout data which is updated based on the way of thinking of Embodiment 1 and Embodiment 2, the size shift due to the variation in the etching amount may occur.

Accordingly, when forming the pixel electrode PX and the counter electrode CT based on the way of thinking of Embodiment 1 and Embodiment 2, in consideration of the variation in the etching amount, if the gaps $Lg1_1$, $Lg2_1$, $Lg3_1$, $Lg4_1$ between the pixel electrode PX and the counter electrode CT in the first pixel SP1, and the gaps $Lg1_2$, $Lg2_2$, $Lg3_2$, $Lg4_2$ between the pixel electrode PX and the counter electrode CT in the second pixel SP2, as illustrated in FIG. 4F, satisfy the relationship shown by Equation 2 to Equation 5, it is regarded that the gap between the pixel electrode PX and the counter electrode CT in each pixel is equal to the size in the updated layout data.

$$Lg1_1 > Lg1_2 - \frac{\sigma}{L_{DA}} \times L_{12} \qquad \text{(Equation 2)}$$

$$Lg2_1 > Lg2_2 - \frac{\sigma}{L_{DA}} \times L_{12} \qquad \text{(Equation 3)}$$

$$Lg3_1 > Lg3_2 - \frac{\sigma}{L_{DA}} \times L_{12} \qquad \text{(Equation 4)}$$

$$Lg4_1 > Lg4_2 - \frac{\sigma}{L_{DA}} \times L_{12} \qquad \text{(Equation 5)}$$

In Equation 2 to Equation 5, $L_{DA}$ denotes a diagonal dimension of the display area DA in FIG. 14A. σ denotes a difference of the etching amount between the pixel SP5 and the pixel SP6, i.e., the two pixels most remotely located on the diagonal illustrated in FIG. 14A, wherein the etching amount corresponds to the gap between the pixel electrode PX and the counter electrode CT of each pixel. When the degree of change of the etching amount is known, it is expected that the brightness unevenness arising from the difference in the write current value of each TFT can be reduced furthermore, for example, by updating the layout data of the pixel electrode PX and the counter electrode CT in Step 408 illustrated in FIG. 5, taking into consideration the change of the etching amount as well.

In the above, the present invention has been concretely explained based on the embodiments, but the present invention is not limited to the embodiments. It is needless to say that the present invention can be changed variously in the range which does not deviate from the gist.

For example, in Embodiment 1 and Embodiment 2, the TFT substrate 101 of the structure in which one pixel possesses structure illustrated in FIG. 3A to FIG. 3C has been explained as the example. However, it is needless to say that the present invention is applicable to a TFT substrate 101 in which the pixel electrode PX and the counter electrode CT are, for example, arranged in an opposing manner on the same surface of the second insulating layer PAS2, and that the plane shape of the pixel electrode PX and the counter electrode CT may be changed suitably. Naturally, the spatial relationship of the holding capacity line SL and the scanning signal line GL, the structure of TFT, the position of the through-hole TH1 which connects the pixel electrode PX with the source electrode SD2, the position of the through-hole TH2 which connects the counter electrode CT with the holding capacity line SL, etc. can be changed suitably.

Although the TFT substrate 101 used in the liquid crystal display panel 1 is explained as the example from Embodiment 1 to Embodiment 3, the present invention is not limited to the embodiments. It is needless to say that the present invention can be applied to, for example, a substrate used for a display panel (display device) of other display formats, the display panel possessing structure similar to the structure illustrated in FIG. 3A to FIG. 3C. The display panel of other display formats to which the present invention can be applied includes a self-luminous display device which uses organic EL (Electro Luminescence), for example.

What is claimed is:

1. A display device comprising:
 a display panel which, over a surface of an insulating substrate, includes:
 a plurality of scanning signal lines;
 a plurality of picture signal lines;
 a plurality of TFTs;
 a plurality of pixel electrodes coupled to sources of the TFTs; and
 a counter electrode,
 wherein the TFTs and the pixel electrodes are arranged in a matrix in a projection direction of the scanning signal lines and a projection direction of the picture signal lines, and the pixel electrodes and the counter electrode are arranged over the same surface of an insulating layer overlying the surface of the insulating substrate,
 wherein, when a value of a channel width divided by a channel length of one TFT among the TFTs is greater than a value of a channel width divided by a channel length of another TFT among the TFTs, a gap between a pixel electrode coupled to the source of the one TFT and the counter electrode is set to be wider than a gap between a pixel electrode coupled to the source of the another TFT and the counter electrode, and
 wherein a gate insulating film in the one TFT is thinner than a gate insulating film in the another TFT.

2. The display device according to claim 1,
 wherein, assuming $L_{DA}$ to denote a distance between two pixel electrodes most remotely located among the pixel electrodes arranged in a matrix over a sheet of the insulating substrate, σ to denote an etching amount difference produced at the gap between the pixel electrode and the counter electrode located at each of the two points mutually separated by the distance $L_{DA}$, and $L_{12}$ to denote a distance between a pixel electrode coupled to the source of the one TFT and a pixel electrode coupled to the source of the another TFT, a gap, $Lg_1$, between the pixel electrode coupled to the source of the one TFT and the counter electrode and a gap, $Lg_2$, between the pixel electrode coupled to the source of the another TFT and the counter electrode satisfy a relationship described by Equation 1.

$$Lg_1 > Lg_2 - \frac{\sigma}{L_{DA}} \times L_{12} \qquad \text{(Equation 1)}$$

3. The display device according to claim 1,
 wherein, in a number of pixel electrodes aligned in the projection direction of the scanning signal line, a gap between a pixel electrode and the counter electrode is widest when the pixel electrode is located nearest to one of both ends of the scanning signal line in the projection direction of the scanning signal line and the gap becomes narrower as the pixel electrode is located farther away from the one of both ends of the scanning signal line.

4. The display device according to claim 1,
 wherein, in a number of pixel electrodes aligned in the projection direction of the scanning signal line, a gap between a pixel electrode and the counter electrode is widest when the pixel electrode is located nearest to a specific position to the scanning signal line, the specific position being different from either end of the scanning signal line in the projection direction of the scanning signal line, and the gap becomes narrower as the pixel electrode is located farther away from the specific position to the scanning signal line.

5. The display device according to claim 4,
 wherein the specific position to the scanning signal line is a median point of both ends of the insulating substrate, the both ends being in the same direction as the projection direction of the scanning signal line.

6. The display device according to claim 4,
wherein the specific position to the scanning signal line is a median point of both ends of the scanning signal line, the both ends being in the projection direction of the scanning signal line concerned.

7. The display device according to claim 1,
wherein, in a number of pixel electrodes aligned in the projection direction of the picture signal line, a gap between a pixel electrode and the counter electrode is widest when the pixel electrode is located nearest to one of both ends of the picture signal line in the projection direction of the picture signal line and the gap becomes narrower as the pixel electrode is located farther away from the one of both ends of the picture signal line.

8. The display device according to claim 1,
wherein, in a number of pixel electrodes aligned in the projection direction of the picture signal line, a gap between a pixel electrode and the counter electrode is widest when the pixel electrode is located nearest to a specific position to the picture signal line, the specific position being different from either end of the picture signal line in the projection direction of the picture signal line, and the gap becomes narrower as the pixel electrode is located farther away from the specific position to the picture signal line.

9. The display device according to claim 8,
wherein the specific position to the picture signal line is a median point of both ends of the insulating substrate, the both ends being in the same direction as the projection direction of the picture signal line.

10. The display device according to claim 8,
wherein the specific position to the picture signal line is a median point of both ends of the picture signal line, the both ends being in the projection direction of the picture signal line concerned.

11. The display device according to claim 1,
wherein the display panel is a liquid crystal display panel in which a liquid crystal is enclosed in a space between two substrates, and
wherein the insulating substrate which includes the scanning signal lines, the picture signal lines, the TFTs, the pixel electrodes, and the counter electrode, is one of the two substrates.

* * * * *